(12) United States Patent
Lee et al.

(10) Patent No.: US 12,557,522 B2
(45) Date of Patent: Feb. 17, 2026

(54) DISPLAY DEVICE AND ELECTRONIC DEVICE INCLUDING ENCAPSULATION SUBSTRATE AND GROOVE PATTERN

(71) Applicant: SAMSUNG DISPLAY CO., LTD., Yongin-si (KR)

(72) Inventors: Jae-Man Lee, Anyang-si (KR); Hoon Kim, Asan-si (KR); Hwiseong Kim, Seongnam-si (KR); Donghoo Kim, Cheonan-si (KR); Sunyoung Kim, Cheonan-si (KR); Hee-Won Yoon, Asan-si (KR); Seungwon Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 456 days.

(21) Appl. No.: 18/157,767

(22) Filed: Jan. 20, 2023

(65) Prior Publication Data
US 2023/0292574 A1    Sep. 14, 2023

(30) Foreign Application Priority Data
Mar. 8, 2022   (KR) .......................... 10-2022-0029101

(51) Int. Cl.
*H10K 59/65* (2023.01)
*H10K 59/122* (2023.01)
(Continued)

(52) U.S. Cl.
CPC .......... *H10K 59/65* (2023.02); *H10K 59/122* (2023.02); *H10K 59/40* (2023.02); *H10K 59/873* (2023.02);
(Continued)

(58) Field of Classification Search
CPC ...... H10K 59/65; H10K 59/122; H10K 59/40; H10K 59/873; H10K 59/124; H10K 59/12;
(Continued)

(56) References Cited

U.S. PATENT DOCUMENTS 11,004,914 B2   5/2021   Jo et al.
12,010,866 B2   6/2024   Lee et al.
(Continued)

FOREIGN PATENT DOCUMENTS

KR   10-2018-0045119      6/2018
KR   10-2020-0003334 A    1/2020
(Continued)

*Primary Examiner* — Ida M Soward
(74) *Attorney, Agent, or Firm* — F. CHAU & ASSOCIATES, LLC

(57) ABSTRACT

A display device includes a signal transmission region, a display region spaced apart from the signal transmission region, a peripheral region located between the signal transmission region and the display region, a base layer, a circuit layer disposed on the base layer, a light emitting element layer disposed on the circuit layer and that includes a light emitting element that overlaps the display region, an encapsulation substrate disposed on the light emitting element layer, a hole defined in the signal transmission region and that passes through at least a portion of each of the circuit layer and the light emitting element layer, and a groove pattern defined on one surface of the encapsulation substrate and that overlaps the peripheral region.

22 Claims, 19 Drawing Sheets

(51) Int. Cl.
  *H10K 59/40*   (2023.01)
  *H10K 59/80*   (2023.01)
  *H10K 50/80*   (2023.01)
  *H10K 50/842*   (2023.01)
  *H10K 50/844*   (2023.01)
  *H10K 59/12*   (2023.01)
  *H10K 59/124*   (2023.01)

(52) U.S. Cl.
  CPC ....... *H10K 50/8426* (2023.02); *H10K 50/844* (2023.02); *H10K 50/868* (2023.02); *H10K 59/12* (2023.02); *H10K 59/124* (2023.02); *H10K 59/8792* (2023.02)

(58) Field of Classification Search
  CPC .. H10K 59/8792; H10K 50/85; H10K 50/841; H10K 50/868; H10K 50/844; H10K 50/8426
  See application file for complete search history.

(56) References Cited

U.S. PATENT DOCUMENTS

| | | | |
|---|---|---|---|
| 12,414,444 B2* | 9/2025 | Kim | H10K 59/122 |
| 2019/0058121 A1* | 2/2019 | Tanaka | H05B 33/10 |
| 2019/0074478 A1* | 3/2019 | Kwon | H10K 59/131 |
| 2020/0161582 A1* | 5/2020 | Choi | H10K 59/121 |
| 2021/0005836 A1* | 1/2021 | Yee | H10K 50/841 |
| 2021/0033935 A1* | 2/2021 | Su | G02F 1/136213 |
| 2021/0288118 A1* | 9/2021 | Lee | H10K 59/131 |
| 2022/0069038 A1* | 3/2022 | Choi | H10K 59/126 |
| 2022/0123255 A1* | 4/2022 | Kim | H10K 71/00 |

FOREIGN PATENT DOCUMENTS

| | | | |
|---|---|---|---|
| KR | 10-2020-0013819 | 2/2020 | |
| KR | 10-2020-0060594 A | 6/2020 | |
| KR | 10-2171375 | 10/2020 | |
| KR | 10-2021-0027715 A | 3/2021 | |
| WO | WO-2020004789 A1 * | 1/2020 | ......... H10K 59/8731 |

* cited by examiner

DISPLAY DEVICE AND ELECTRONIC DEVICE INCLUDING ENCAPSULATION SUBSTRATE AND GROOVE PATTERN

CROSS-REFERENCE TO RELATED APPLICATIONS

This U.S. non-provisional patent application claims priority under 35 U.S.C. § 119 from Korean Patent Application No. 10-2022-0029101, filed on Mar. 8, 2022 in the Korean Intellectual Property Office, the contents of which are herein incorporated by reference in their entirety.

TECHNICAL FIELD

Embodiments of the present disclosure herein are directed to a display device and an electronic device that includes same, and more particularly, to a display device that includes a signal transmission region through which a light signal passes; and an electronic device that includes the same.

DISCUSSION OF THE RELATED ART

Mobile electronic devices are widely used, and their functions have become increasingly diversified. Many users prefer an electronic device that has a wide display region and a narrow non-display region.

An electronic device typically includes various electronic components, such as a display panel that displays an image, an input sensor that detects an external input, and an electronic module. These electronic components are electrically connected to each other by signal lines. The electronic module may be one or more of a camera, an infrared detection sensor, a proximity sensor, etc. The electronic module is typically located below the display panel and the input sensor. A hole that exposes the electronic module is provided in the display panel and the input sensor, and the hole is filled with a resin that adjusts transmittance. However, the resin filling the hole may leak into a pixel of a display unit and cause a pixel defect.

SUMMARY

Embodiments of the present disclosure provide a display device that increases a function of an electronic module and prevents a pixel defect, and an electronic device that includes same.

An embodiment of the inventive concept provides a display device that includes a signal transmission region, a display region spaced apart from the signal transmission region, a peripheral region located between the signal transmission region and the display region, a base layer, a circuit layer disposed on the base layer, a light emitting element layer disposed on the circuit layer and that includes a light emitting element that overlaps the display region, an encapsulation substrate disposed on the light emitting element layer, a hole defined in the signal transmission region and that passes through at least a portion of each of the circuit layer and the light emitting element layer, and a groove pattern defined on one surface of the encapsulation substrate and that overlaps with the peripheral region.

In an embodiment, the encapsulation substrate includes a first surface and a second surface that face each other, wherein the first surface is disposed on the light emitting element layer, and the second surface is located above the first surface, wherein the groove pattern has a shape recessed from a portion of the first surface toward the second surface.

In an embodiment, the peripheral region surrounds at least a portion of the signal transmission region when viewed in a plan view.

In an embodiment, the display device further includes a light compensation layer that is located between the encapsulation substrate and the base layer and that overlaps the hole, wherein the light compensation layer overlaps the signal transmission region and the peripheral region but does not overlap the display region when viewed in a plan view.

In an embodiment, the display device further includes an input sensor disposed on the encapsulation substrate, wherein the input sensor includes a cover pattern that overlaps the peripheral region and an insulating layer that covers the cover pattern.

In an embodiment, the input sensor further includes a first conductive pattern located in the same layer as the cover pattern and a second conductive pattern disposed on the insulating layer.

In an embodiment, the light emitting element does not overlap the signal transmission region or the peripheral region.

In an embodiment, the groove pattern has a closed curve shape that surrounds the hole when viewed in a plan view.

In an embodiment, the groove pattern includes a first groove pattern that has a closed curved shape that surrounds the hole when viewed in a plan view and a second groove pattern that has a closed curved shape that surrounds the first groove pattern when viewed in the plan view.

In an embodiment, a depth of the first groove pattern is equal to a depth of the second groove pattern.

In an embodiment, a depth of the first groove pattern differs from a depth of the second groove pattern.

In an embodiment, the groove pattern includes a plurality of groove patterns, and the plurality of groove patterns are spaced apart from each other and surround the hole when viewed in a plan view, and each of the plurality of groove patterns has one of circular or polygonal shape.

In an embodiment, the circuit layer includes a plurality of insulating layers disposed in the peripheral region and the display region, and the light emitting element layer further includes a pixel defining layer disposed on the plurality of insulating layers.

In an embodiment, the display device further includes a first dam disposed in the peripheral region and that includes the pixel defining layer and surrounds at least a portion of the hole, and a second dam disposed in the peripheral region and that includes the pixel defining layer and surrounds at least a portion of the first dam. The groove pattern is located between the first dam and the second dam.

In an embodiment, a height of the second dam is greater than a height of the first dam.

In an embodiment of the inventive concept, a display device includes a base layer that includes a display region and a non-display region, a circuit layer disposed on the base layer, a light emitting element layer disposed on the circuit layer and that includes a light emitting element located in the display region, an encapsulation substrate disposed on the light emitting element layer, and an outer groove pattern formed on one surface of the encapsulation substrate and that overlaps the non-display region.

In an embodiment of the inventive concept, an electronic device includes a display device. The display device includes a base layer, a circuit layer disposed on the base layer, a light emitting element layer disposed on the circuit layer and that includes a light emitting element, an encapsulation substrate disposed on the light emitting element layer, a hole formed in each of the circuit layer and the light emitting element layer and that passes through at least a portion thereof, and a groove pattern formed on a lower surface of the encapsulation substrate and adjacent to the hole. The groove pattern is located between the hole and the light emitting element when viewed in a plan view.

In an embodiment, the electronic device further includes a light compensation layer disposed between the light emitting element layer and the encapsulation substrate, where the light compensation layer covers the hole and does not overlap the light emitting element.

In an embodiment, the electronic device further includes an input sensor disposed on the encapsulation substrate. The input sensor includes a cover pattern that overlaps with the groove pattern, a first conductive layer, a first insulating layer that covers the cover pattern and the first conductive layer, a second conductive layer disposed on the first insulating layer, and a second insulating layer that covers the second conductive layer.

In an embodiment, the display device further includes an electronic module disposed below the base layer and that overlaps the hole when viewed in a plan view.

In an embodiment of the inventive concept, a display device includes a circuit layer disposed on a base layer, a light emitting element layer disposed on the circuit layer and that comprises a light emitting element, an encapsulation substrate disposed on the light emitting element layer and that includes a first surface disposed on the light emitting element layer, and a second surface located above the first surface, a hole that passes through at least a portion of each of the circuit layer and the light emitting element layer, and a groove pattern recessed from a portion of the first surface of the encapsulation substrate toward the second surface of the encapsulation substrate. The groove pattern has a closed curved shape that surrounds the hole when viewed in a plan view.

In an embodiment, the display device further includes a signal transmission region, a display region spaced apart from the signal transmission region, and a peripheral region located between the signal transmission region and the display region. The light emitting element overlaps the display region, the hole is formed in the signal transmission region, and the groove pattern overlaps the peripheral region.

Figure 8:
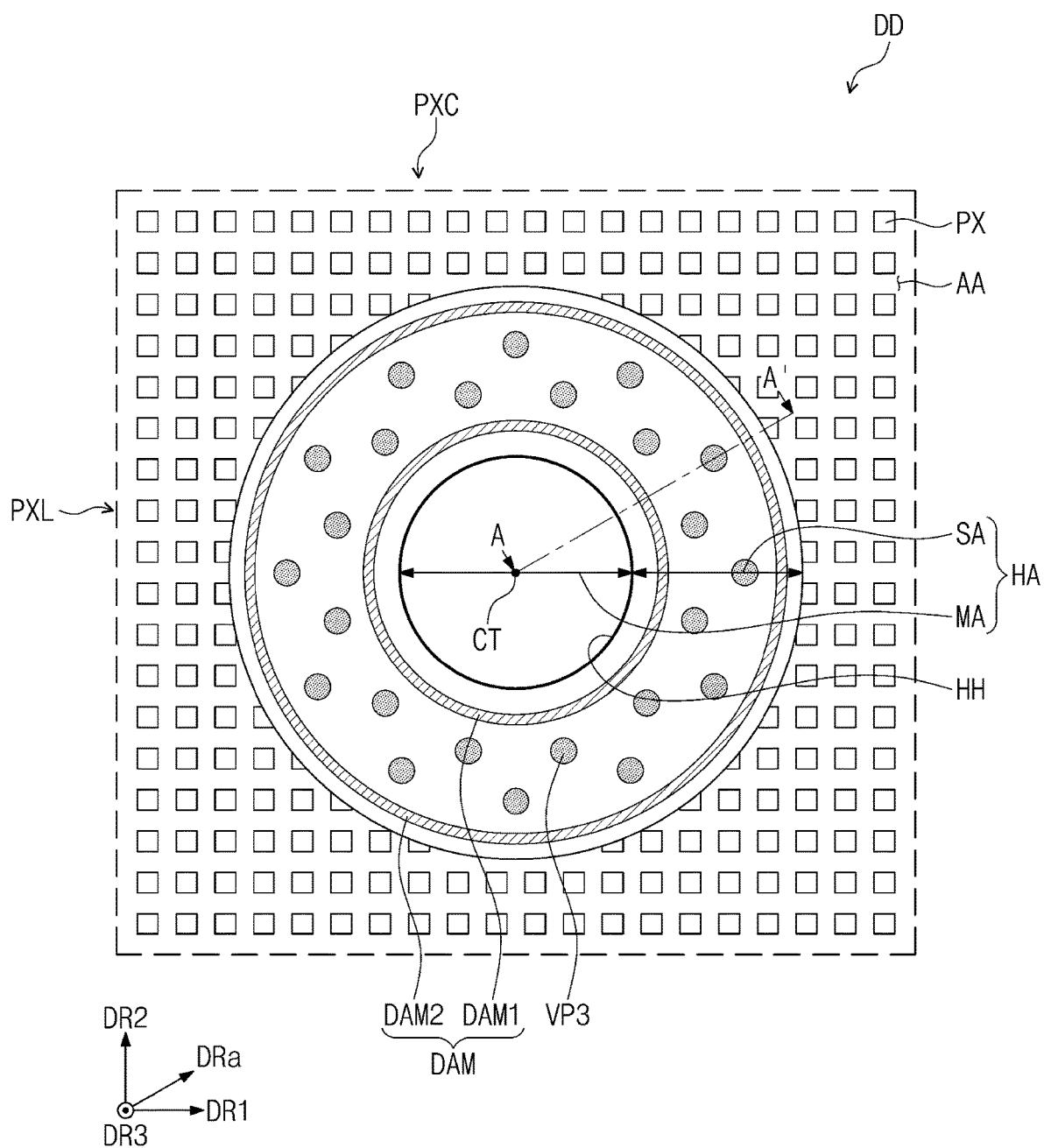
Figure 9:
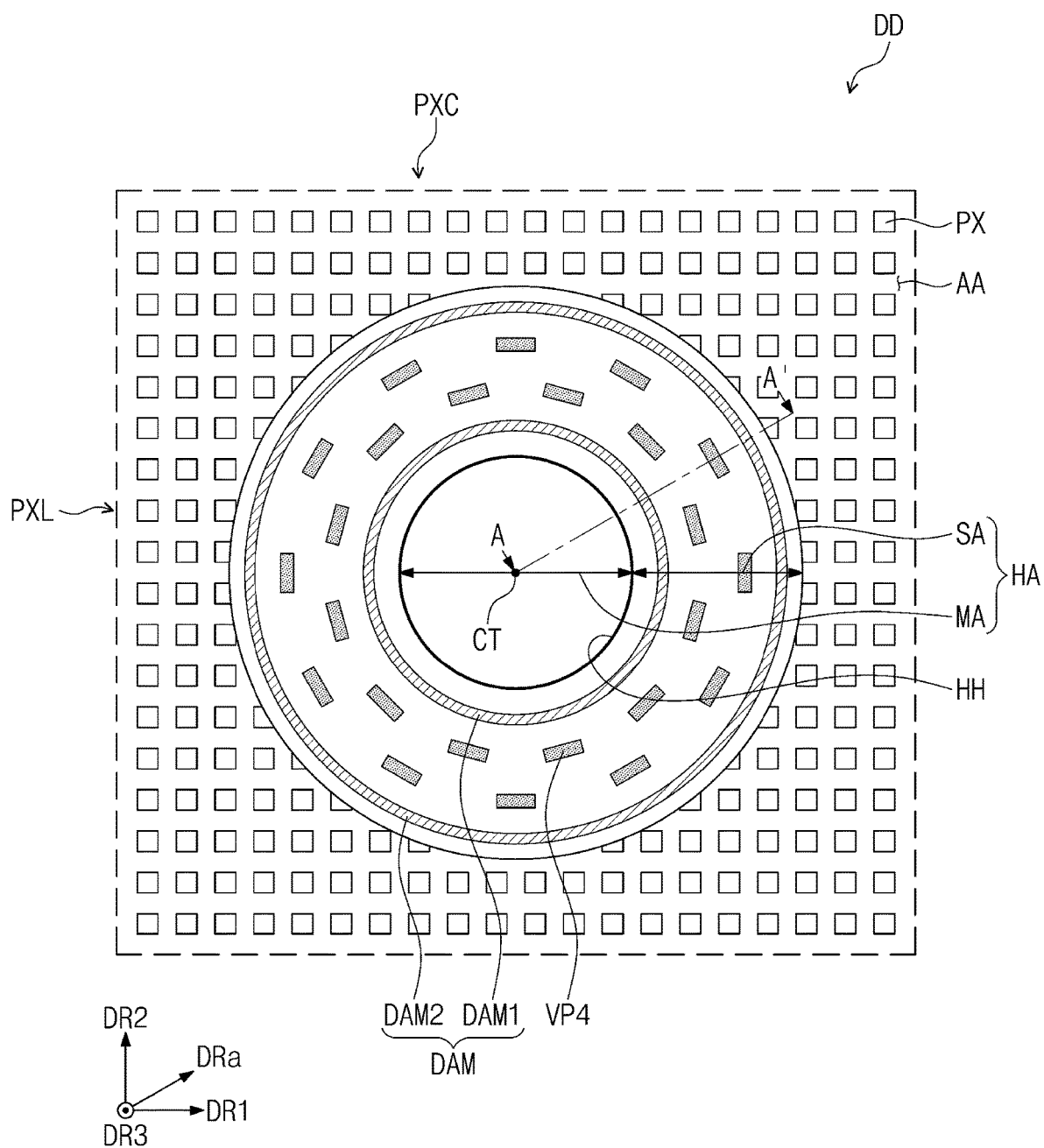

Each of FIGS. 8 and 9 is an enlarged plan view of a portion of a display device according to an embodiment of the inventive concept.

Figure 10A:
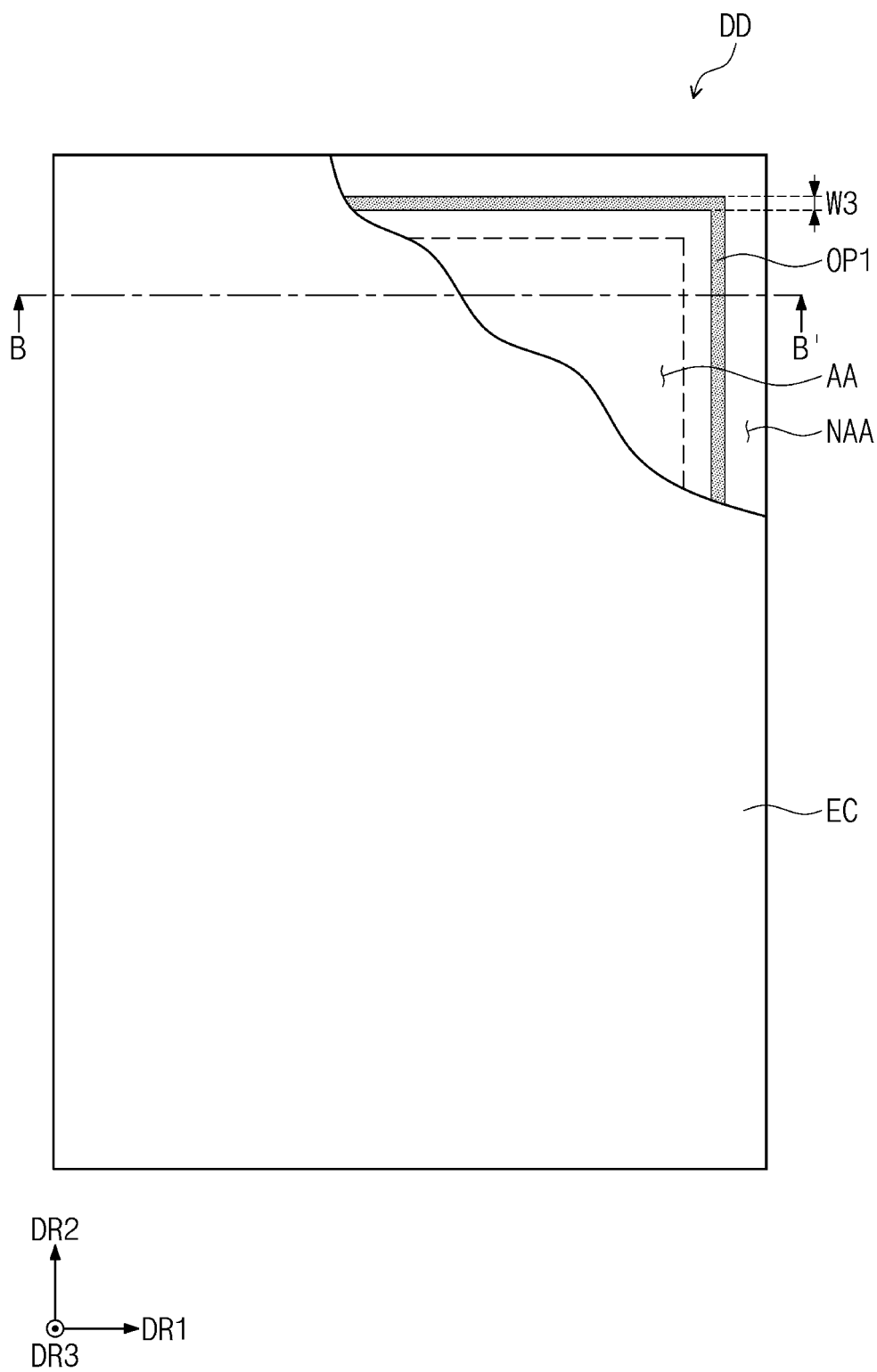

FIG. 10A is a plan view of a display device according to an embodiment of the inventive concept.

Figure 10B:
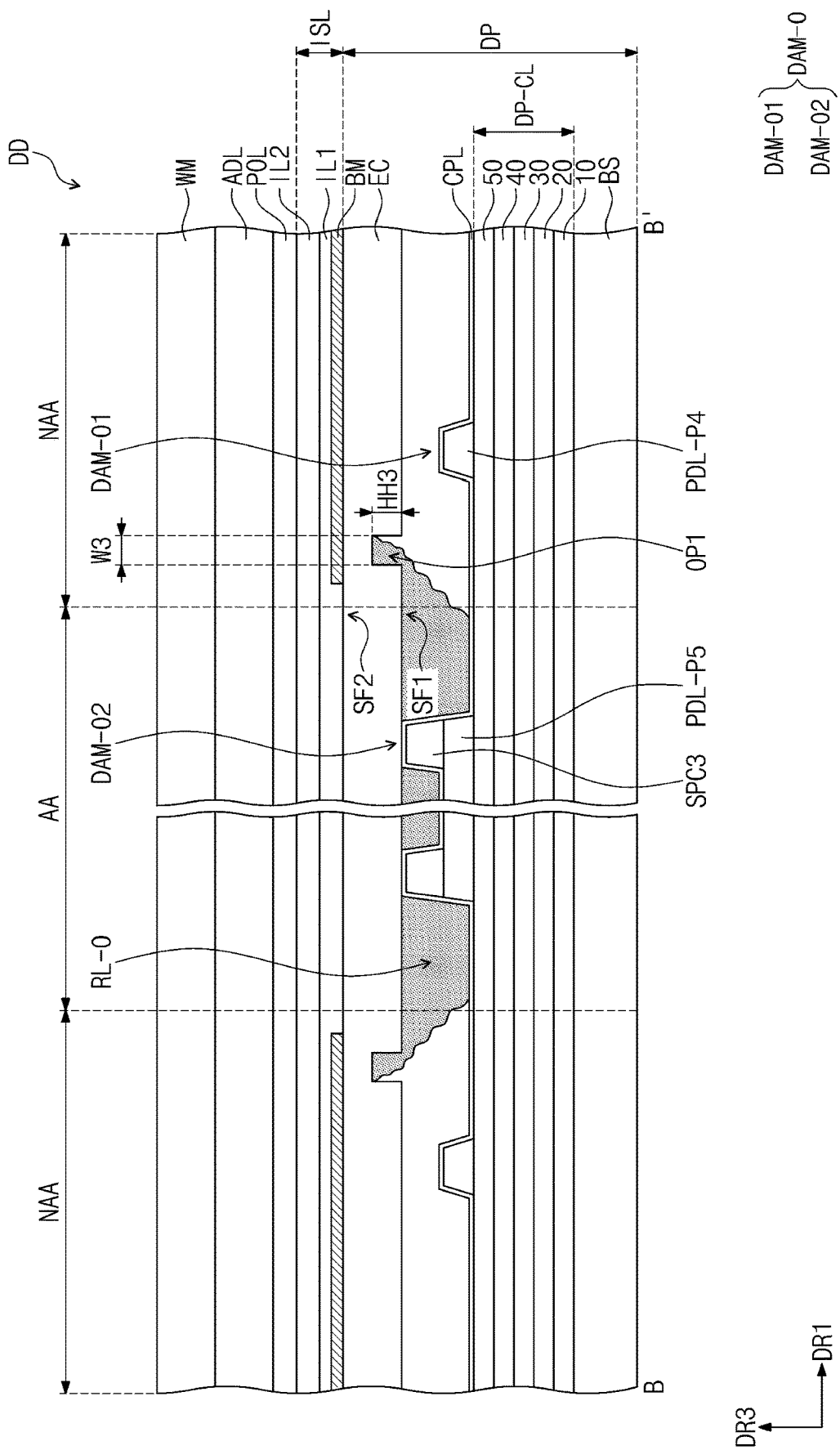

FIG. 10B is a cross-sectional view of a display device according to an embodiment of the inventive concept.

Figure 11A:
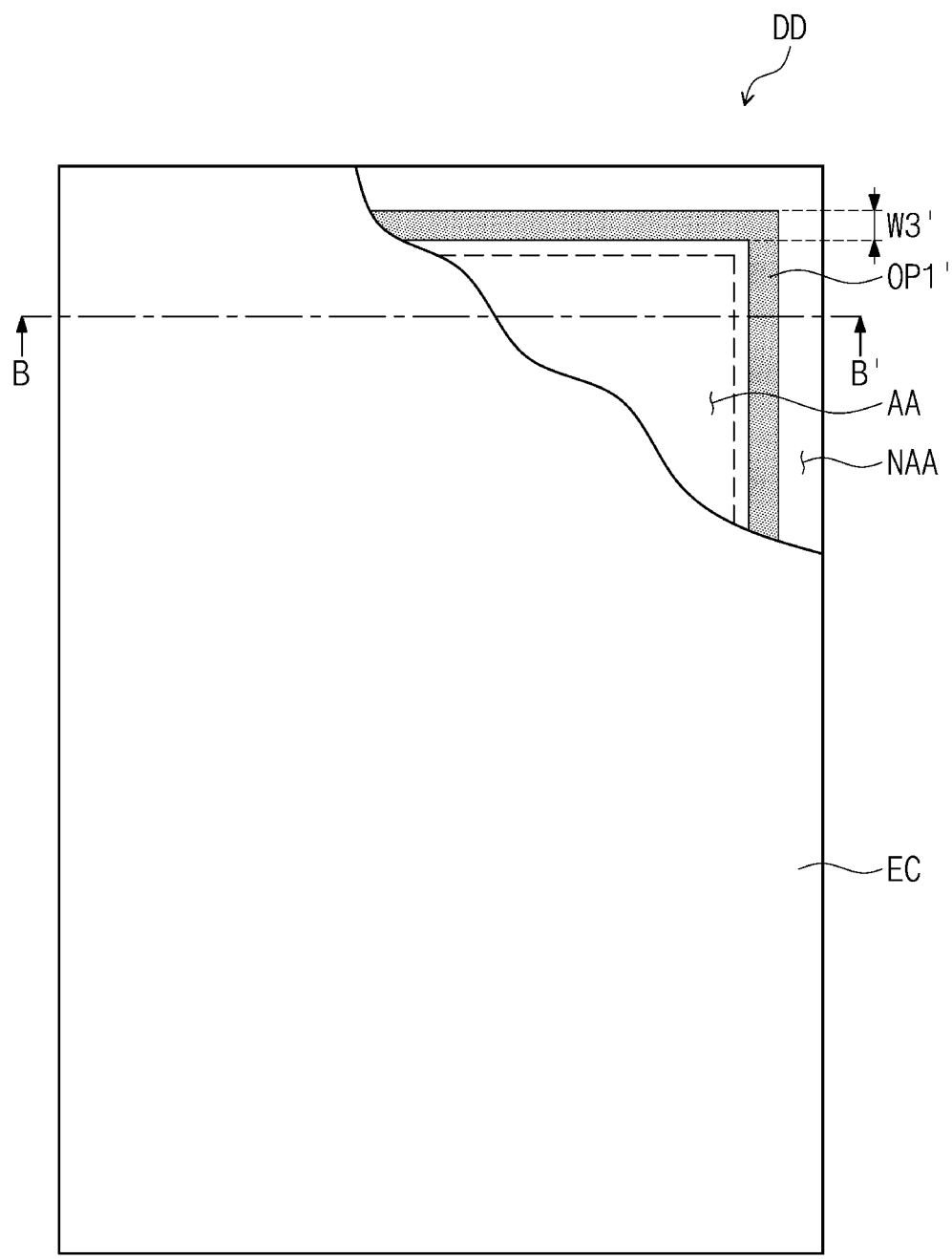

FIG. 11A is a plan view of a display device according to an embodiment of the inventive concept.

FIG. 1B is a cross-sectional view of a display device according to an embodiment of the inventive concept.

Figure 12A:
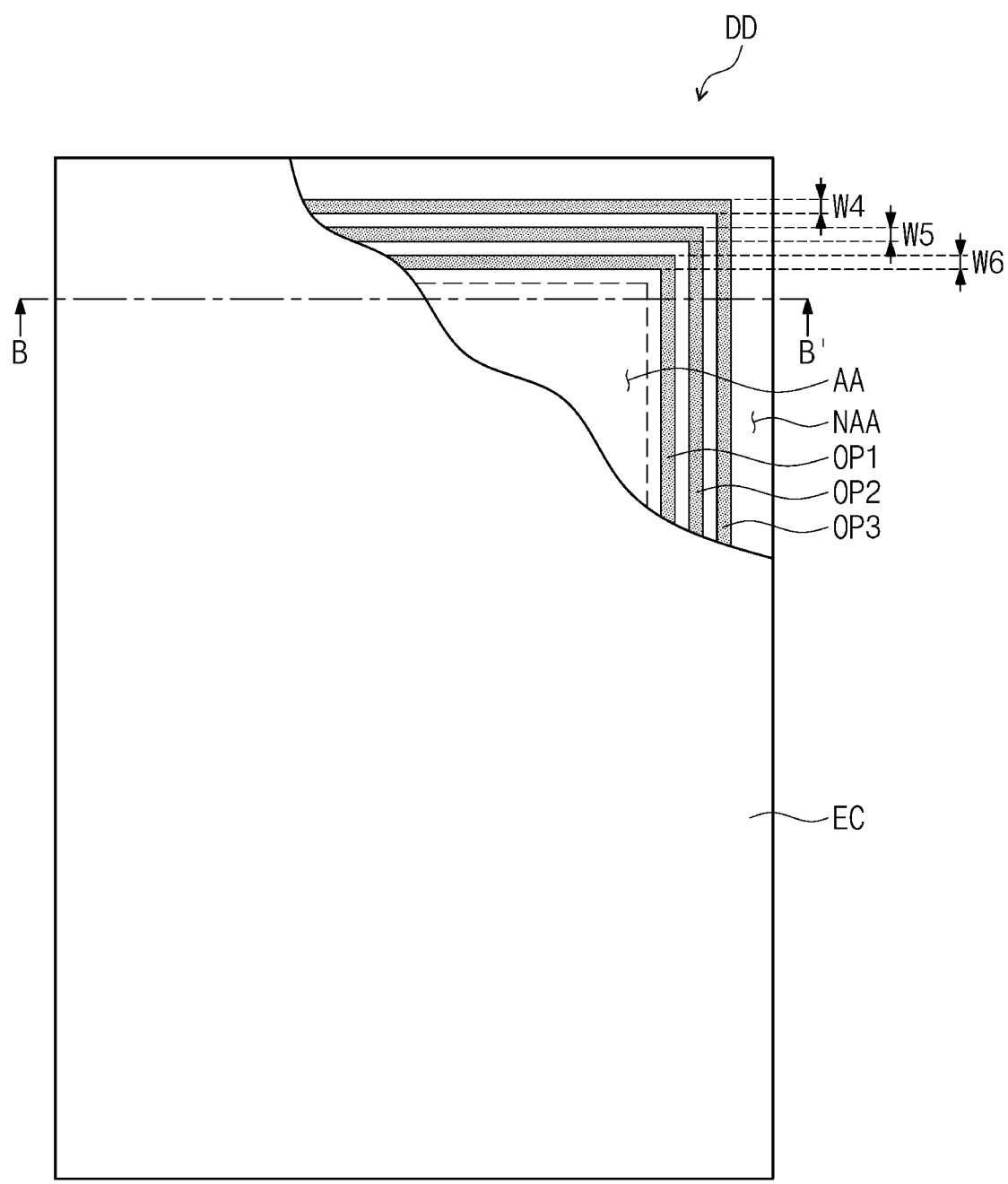

FIG. 12A is a plan view of a display device according to an embodiment of the inventive concept.

Figure 12B:
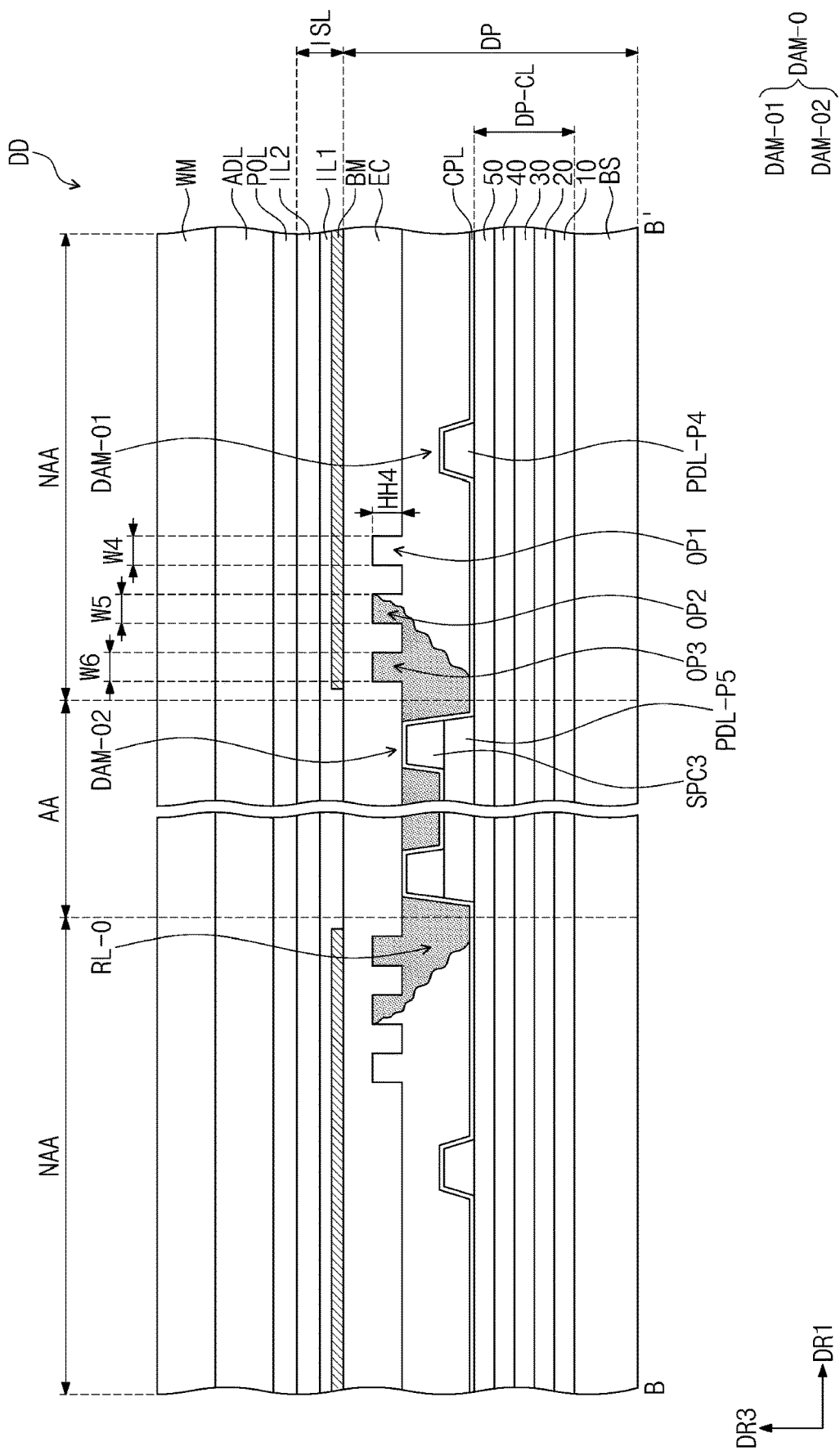

FIG. 12B is a cross-sectional view of a display device according to an embodiment of the inventive concept.

Figure 13:
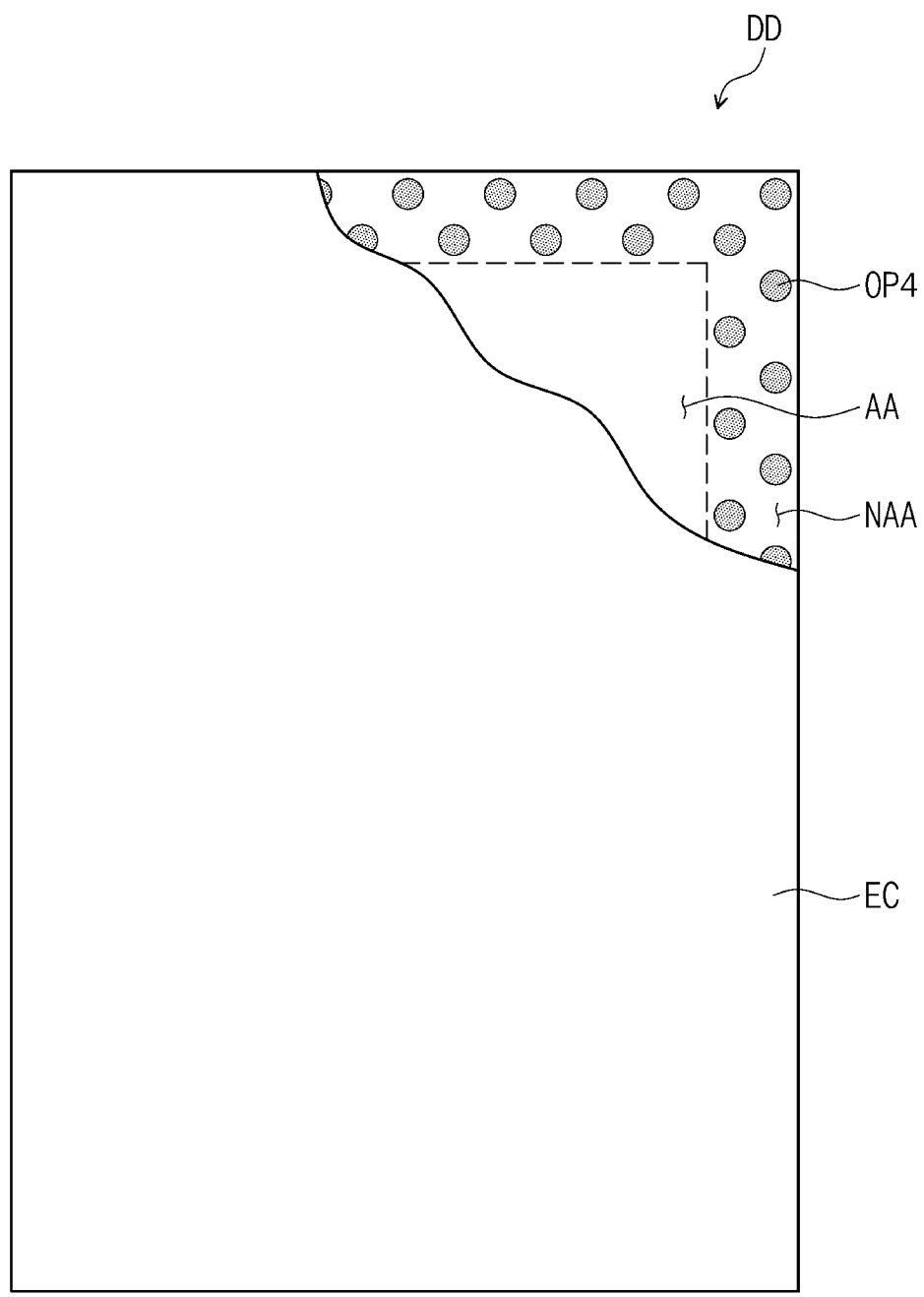

FIG. 13 is a plan view of a display device according to an embodiment of the inventive concept.

DETAILED DESCRIPTION

Hereinafter, embodiments of the inventive concept will be described with reference to the drawings.

It will be understood that when an element, or a region, a layer, a portion, etc., is referred to as "being on", "connected to" or "coupled to" another element, it can be directly connected or coupled to another element, or intervening elements may be disposed therebetween.

Like numbers may refer to like elements throughout.

Hereinafter, a display panel and a manufacturing method therefor according to an embodiment of the inventive concept will be described with reference to the drawings.

Figure 1:
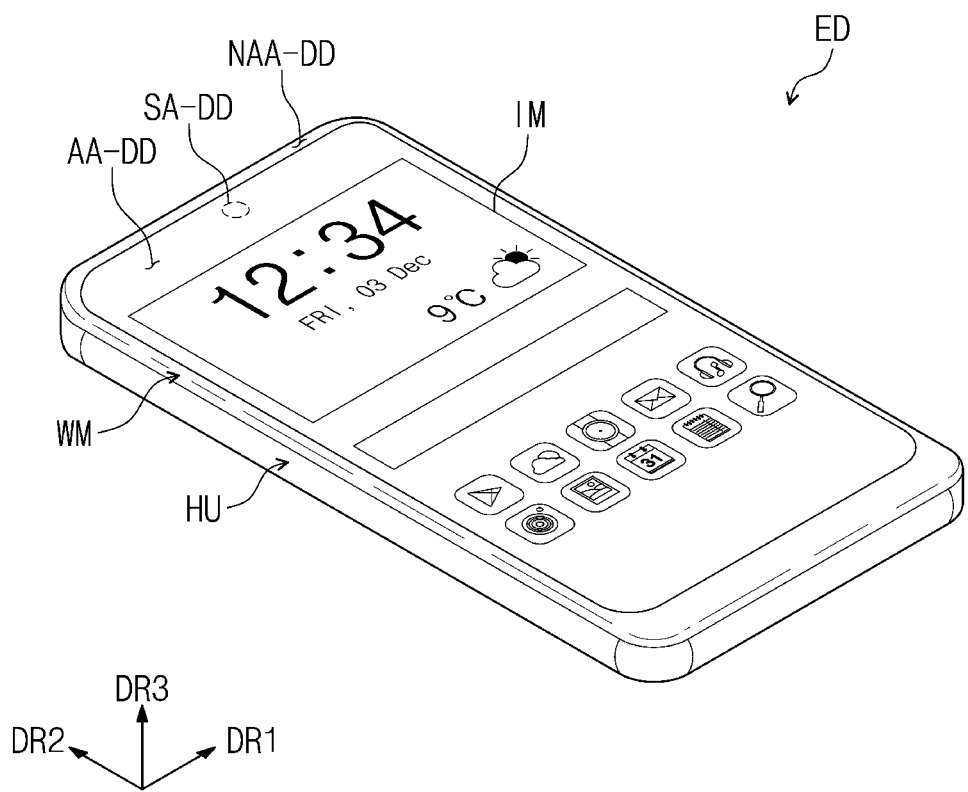
FIG. 1 is a perspective view of an electronic device according to an embodiment of the inventive concept.
Figure 2:
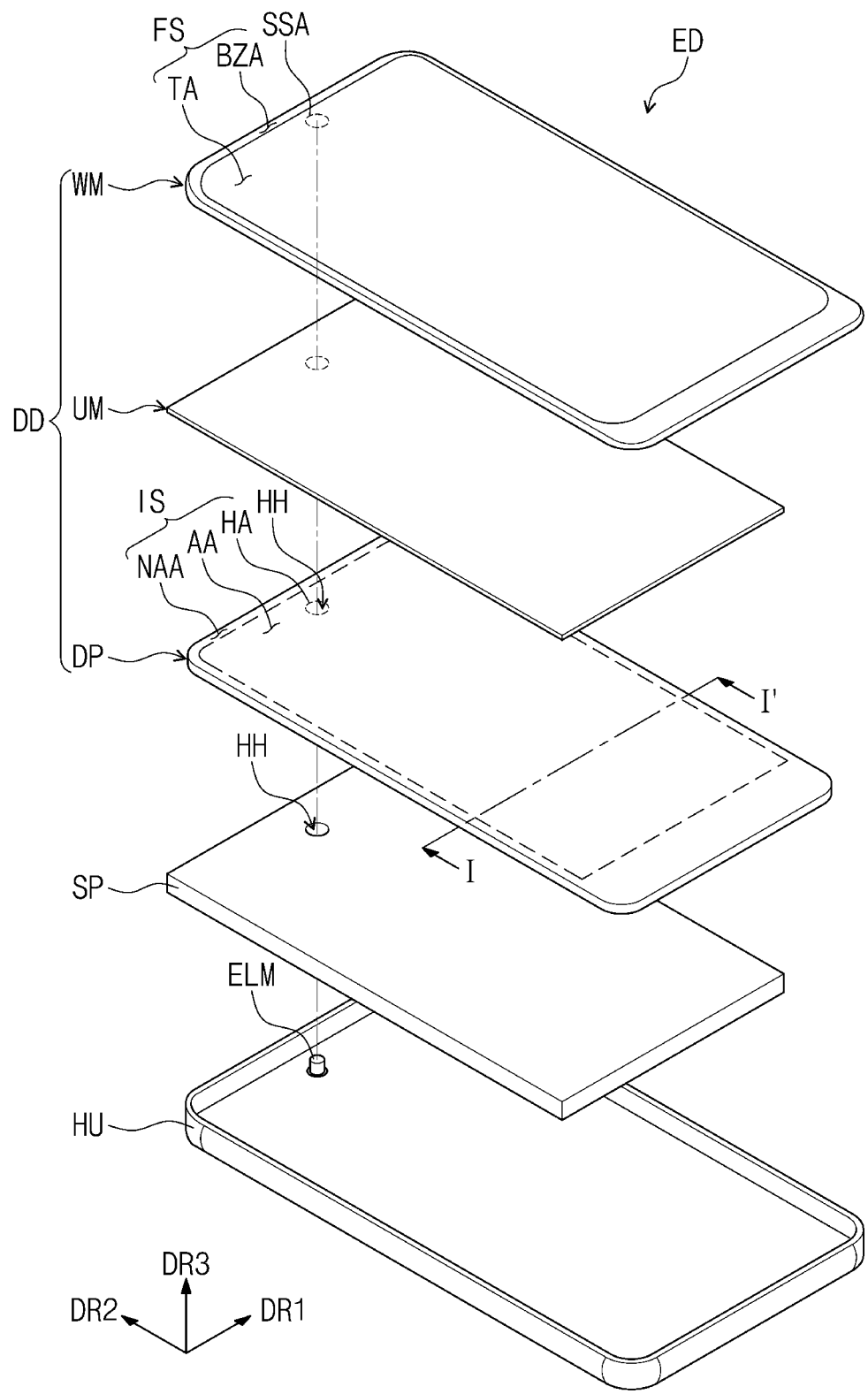
FIG. 2 is an exploded perspective view of an electronic device according to an embodiment of the inventive concept.

FIG. 1 is a perspective view of an electronic device according to an embodiment of the inventive concept. FIG. 2 is an exploded perspective view of an electronic device according to an embodiment of the inventive concept.

An electronic device ED according to an embodiment is activated in response to an electrical signal. For example, the electronic device ED may be one of a mobile phone, a tablet PC, a vehicle navigation unit, a game console, or a wearable device, but embodiments are not necessarily limited thereto. FIG. 1 illustrates a mobile phone as the electronic device ED.

The electronic device ED according to an embodiment includes an active region AA-DD and a non-active region NAA-DD. An image IM can be displayed in the active region AA-DD of the electronic device ED. In FIG. 1, a clock and a plurality of icons are illustrated as examples of the image IM. The active region AA-DD of the electronic device ED according to an embodiment corresponds to a display region AA of a display panel DP that will be described below, and the non-active region NAA-DD corresponds to a non-display region NAA of the display panel DP. In addition, in an embodiment, the active region AA-DD and the non-active region NAA-DD of the electronic device ED correspond to a transmissive region TA and a bezel region BZA of a window WM, respectively.

The electronic device ED displays the image IM in a third direction DR3 on a display surface that is parallel to a plane defined by a first direction DR1 and a second direction DR2. The third direction DR3 is perpendicular to the plane defined by the first direction DR1 and the second direction DR2 The display surface, on which the image IM is displayed, corresponds to an upper surface, such as a front surface, of the electronic device ED and also corresponds to an upper surface FS of the window WM. In addition, the electronic device ED has a three-dimensional shape that has a thickness in the third direction DR3.

In the specification, an upper surface (or a front surface) and a lower surface (or a rear surface) for each member are defined with respect to the direction in which the image IM is displayed. The upper and lower surfaces are opposed to each other in the third direction DR3, and the normal direction of each of the upper and lower surfaces is parallel to the third direction DR3. In addition, directions indicated as the first to third directions DR1, DR2, and DR3 are relative and can be changed to other directions.

In embodiment, the active region AA-DD has a rectangular shape parallel to the plane defined by the first direction DR1 and the second direction DR2. However, this is an example, and embodiments are not necessarily limited thereto. In other embodiments, the active region AA-DD has various other shapes.

The non-active region NAA-DD blocks light and is located outside the active region AA-DD and surrounds the active region AA-DD. In an embodiment, the non-active region NAA-DD is not disposed on the front surface of the electronic device ED, but rather is disposed on a side surface thereof, in an embodiment, the non-active region NAA-DD is omitted.

A sensing region SA-DD is located inside the active region AA-DD of the electronic device ED according to an embodiment. FIG. 1 shows one sensing region SA-DD, but the number of sensing regions SA-DD is not necessarily limited thereto.

The electronic device ED includes an electronic module ELM that overlaps the sensing region SA-DD. The electronic module ELM receives an external input through the sensing region SA-DD or provides an output through the sensing region SA-DD.

In an embodiment, the electronic device ED is flexible. Being "flexible" means that the electronic device ED is bendable and includes all structures from a completely foldable structure to a structure bendable to the order of several nanometers. For example, the electronic device ED is a curved display device or a foldable display device. In addition, in an embodiment, the electronic device ED is rigid.

The electronic device ED according to an embodiment includes a display device DD and an electronic module ELM. The display device DD includes a display panel DP disposed on the electronic module ELM and an upper member UM disposed on the display panel DP. In addition, the display device DD according to an embodiment includes a window WM disposed on the display panel DP. In addition, the electronic device ED according to an embodiment includes a support member SP and a housing HU located below the display panel DP. In the electronic device ED according to an embodiment illustrated in FIGS. 1 and 2, the window WM and the housing HU are coupled to each other to form the exterior of the electronic device ED.

In the electronic device ED according to an embodiment, the window WM is disposed on the upper member UM.

The window WM includes an optically transparent insulating material. The window WM is flexible. For example, in an embodiment, the window WM includes a polymer film, a substrate that includes a polymer material, or a thin glass substrate. The window WM may further include functional layers such as an anti-reflection layer, an anti-fingerprint layer, or an optical layer that controls a phase.

The window WM includes an externally exposed upper surface FS. The transmissive region TA in the upper surface FS of the window WM is an optically transparent region. The transmissive region TA has a shape that corresponds to the display region AA of the display panel DP. For example, the transmissive region TA overlaps the entire surface of the display region AA, or at least portion thereof. The image displayed in the display region AA of the display panel DP can be viewed from the outside through the transmissive region TA.

The bezel region BZA of the window WM is adjacent to the transmissive region TA and surrounds the transmissive region TA. The bezel region BZA covers the non-display region NAA of the display panel DP and prevents the non-display region NAA from being viewed from the outside. A window sensing region SSA is formed in the transmissive region TA of the window WM. The window sensing region SSA corresponds to the sensing region SA-DD of the electronic device ED.

The electronic device ED according to an embodiment includes at least one adhesive layer. The at least one adhesive layer may be located between the window WM and the upper member UM, or between the upper member UM and the display panel DP. A portion of the at least one adhesive layer is an optically clear adhesive. A portion of the at least one adhesive layer may be omitted.

In the electronic device ED according to an embodiment, the electronic module ELM is an electronic component that outputs or receives an optical signal. For example, the electronic module ELM is a camera module that captures an external image. In addition, in an embodiment, the electronic module ELM is a sensor module such as a proximity sensor or an infrared light emitting sensor.

In the electronic device ED according to an embodiment, the display panel DP is disposed on the electronic module ELM. The display panel DP includes a display region AA and a non-display region NAA adjacent to the display region AA. For example, a front surface IS of the display panel DP includes the display region AA and the non-display region NAA. The display region AA is activated in response to an electrical signal.

The non-display region NAA is adjacent to the display region AA. The non-display region NAA surrounds the display region AA. In the non-display region NAA are arranged a driving circuit or a driving line that drives the display region AA, various signal lines or pads that provide electrical signals to the display region AA, electronic elements, etc.

In the display panel DP according to an embodiment, a hole region HA is located within the display region AA. A hole HH that passes through at least a portion of each of a circuit layer DP-CL, (see FIG. 5B) and a light emitting element layer DP-OLED (see FIG. 5B) of the display panel DP is formed in the hole region HA. The hole region HA corresponds to the sensing region SA-DD of the electronic device ED. The hole HH that is formed in each of the circuit layer DP-CL and the light emitting element layer DP-OLED overlaps the electronic module ELM.

In the electronic device ED according to an embodiment, the upper member UM is located above the display panel DP. The upper member UM is disposed between the display panel DP and the window WM. Depending on a configuration of the upper member UM, the display device DD can sense an external input and/or external pressure. The upper member UM includes various members.

In an embodiment, the upper member UM includes an optical film and an input sensor. The optical film has an anti-reflection function that reduces reflectivity of external light. The input sensor senses a user's external input. The upper member UM further includes an adhesive layer that couples the optical film and the input sensor.

The optical film includes a polarizer and a phase retarder. The polarizer and the phase retarder may be an elongation-type or a coating-type. The input sensor can senses an external input through a capacitive method, a pressure sensing method, or a magnetic induction method. In addition, the optical film may be a color filter layer that includes a polarizing plate or a plurality of filter parts.

The support member SP disposed below the display panel DP includes a cushion layer and a metal support layer. A hole HH is formed in the support member SP. The hole HH corresponds to the hole region HA of the display panel DP. The hole HH corresponds to the sensing region SA-DD of the electronic device ED.

The electronic module ELM overlaps the holes HH formed in the display panel DP and the support member SP. At least a portion of the electronic module ELM is inserted into the holes HH formed in the display panel DP and the support member SP.

Figure 3A:
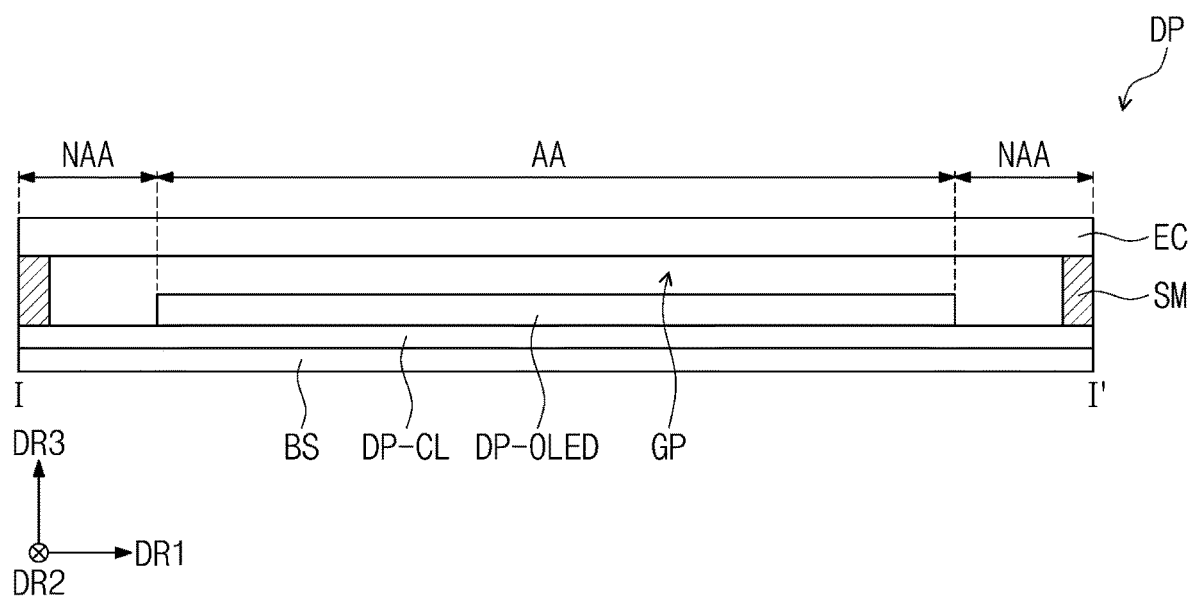
FIGS. 3A and 3B are cross-sectional views of a display panel according to an embodiment of the inventive concept.
Figure 3B:
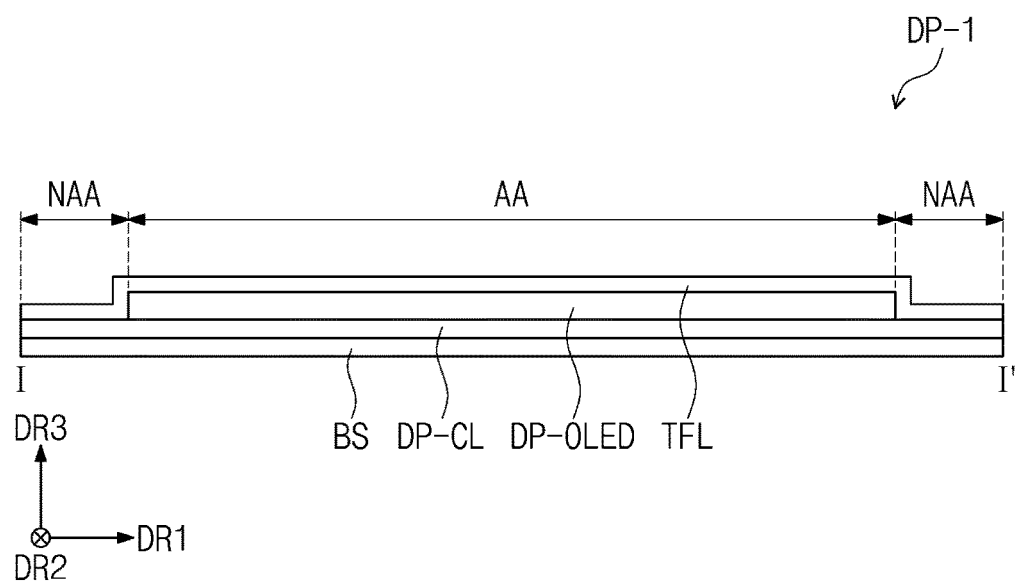

FIG. 3A is a cross-sectional view of a display panel according to an embodiment of the inventive concept. FIG. 3B is a cross-sectional view of a display panel according to an embodiment of the inventive concept. FIGS. 3A and 3B are cross-sectional views taken along line I-I' of FIG. 2. Hereinafter, detailed descriptions of components that are the same as those described with reference to FIGS. 1 and 2 may be summarized or omitted.

As illustrated in FIG. 3A, in an embodiment, the display panel DP includes a base layer BS, a circuit layer DP-CL disposed on the base layer BS, a light emitting element layer DP-OLED disposed on the circuit layer DP-CL, an encapsulation substrate EC that covers the circuit layer DP-CL and the light emitting element layer DP-OLED, and a sealing member SM.

The encapsulation substrate EC according to an embodiment is a transparent substrate. The encapsulation substrate EC includes a glass substrate. In addition, the encapsulation substrate EC has substantially a constant refractive index in a visible light wavelength range. The sealing member SM couples the base layer BS and the circuit layer DP-CL to the encapsulation substrate EC. The sealing member SM extends along an edge of the encapsulation substrate EC.

A gap GP is formed inside the display panel DP and is in a vacuum state. However, embodiments of the inventive concept are not necessarily limited thereto, and in some embodiments, the gap GP is filled with air or an inert gas, hereinafter referred to as an external gas. The encapsulation substrate EC and the sealing member SM prevent moisture from permeating into the display panel DP.

The sealing member SM includes an inorganic adhesive layer such as frit. However, embodiments of the inventive concept are not necessarily limited thereto, and in some embodiments, the sealing member SM includes an organic adhesive layer. In an embodiment, since the display panel DP is completely sealed from the outside, the strength thereof is enhanced, and a failure of a light emitting element can be prevented.

The circuit layer DP-CL includes at least one insulating layer, semiconductor patterns, and conductive patterns. The at least one insulating layer includes at least one inorganic layer and at least one organic layer. The semiconductor patterns and the conductive patterns include signal lines, a pixel driving circuit, and a scan driving circuit. These will be described below in detail.

The light emitting element layer DP-OLED includes a display element, such as an organic light emitting diode. The light emitting element layer DP-OLED further includes an organic layer such as a pixel defining layer.

As illustrated in FIG. 3A, the display region AA and the non-display region NAA, which respectively correspond to the active region AA-DD (see FIG. 1) and the non-active region NAA-DD (see FIG. 1), are defined in the display panel DP. In an embodiment, the expression that regions of different members correspond to each other, means that these regions overlap each other, but they are not necessarily limited to having the same area or shape.

Referring to FIG. 3B, in an embodiment, a display panel DP-1 according to an embodiment of the inventive concept does not include the encapsulation substrate EC and the sealing member SM of the display panel DP illustrated in FIG. 3A. The display panel DP-1 according to an embodiment includes a base layer BS, a circuit layer DP-CL disposed on the base layer BS, a light emitting element layer DP-OLED disposed on the circuit layer DP-CL, and an upper insulating layer TFL disposed on the circuit layer DP-CL and the light emitting element layer DP-OLED. In addition, the base layer BS is one of a plastic substrate, a glass substrate, a metal substrate, an organic/inorganic composite material substrate, etc. The base layer BS includes at least one polyimide layer.

The upper insulating layer TFL includes a plurality of thin films. Some thin films increase optical efficiency, and other thin films protect organic light emitting diodes. The upper insulating layer TFL includes a stack structure of an inorganic layer/an organic layer/an inorganic layer.

The base layer BS is a glass substrate. In addition, the base layer BS has a substantially constant refractive index in a visible light wavelength range.

Hereinafter, an embodiment will be described on the basis of the display panel DP of FIG. 3A.

Figure 4:
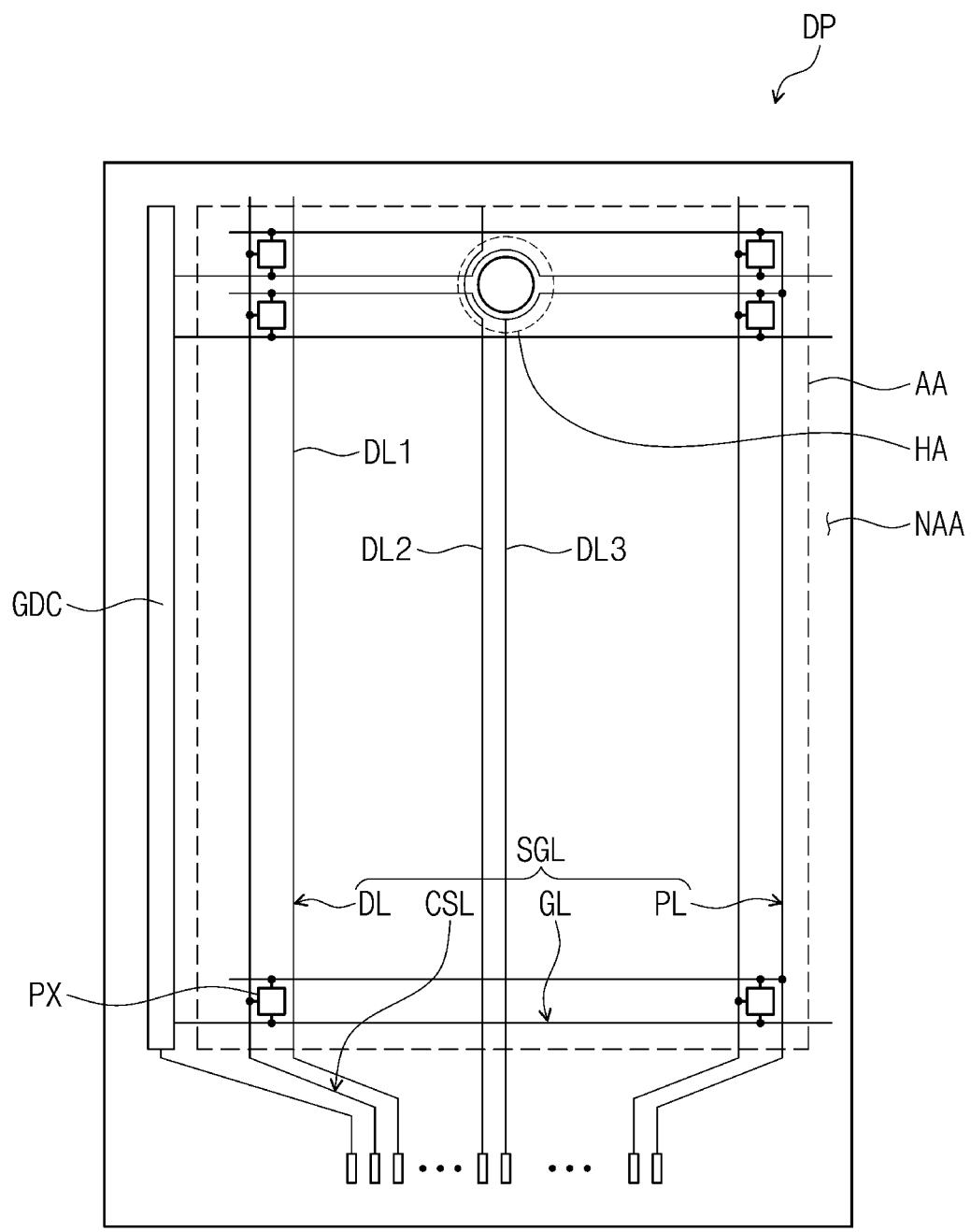
FIG. 4 is a plan view of a display panel according to an embodiment of the inventive concept.

FIG. 4 is a plan view of a display panel according to an embodiment of the inventive concept.

Referring to FIG. 4, in an embodiment, a display region AA and a non-display region NAA are defined in a display panel DP. The non-display region NAA corresponds to the non-active region NAA-DD (see FIG. 1) of the electronic device ED (see FIG. 1). A hole region HA that corresponds to the sensing region SA-DD (see FIG. 1) of the electronic device ED (see FIG. 1), is defined in the display region AA.

The display panel DP includes a plurality of signal lines SGL, a plurality of pixels PX, and a driving circuit GDC. The pixels PX are arranged in the display region AA. Each of the pixels PX includes an organic light emitting diode and a pixel driving circuit connected to the organic light emitting diode. The signal lines SGL and the pixel driving circuit are included in the circuit layer DP-CL illustrated in FIG. 3A.

The pixels PX are not arranged in the hole region HA. An optical signal that is received from the electronic module ELM or enters the electronic module ELM passes through the hole region HA. The light transmittance of the hole region HA is higher than the light transmittance of the display region AA.

The driving circuit GDC is located in the non-display region NAA. In an embodiment, the driving circuit GDC includes a scan driving circuit. The scan driving circuit generates a plurality of scan signals and sequentially outputs the scan signals to a plurality of scan lines GL that will be described below. The scan driving circuit further outputs another control signal to the driving circuit of the pixels PX.

The signal lines SGL include scan lines GL, data lines DL, a power line PL, and a control signal line CSL. The signal lines SGL further include separate reset lines and light emitting lines. The scan lines GL are respectively connected to corresponding pixels PX, and data lines DL are respectively connected to corresponding pixels PX. The power line PL is connected to the pixels PX. The control signal line CSL provides control signals to the scan driving circuit.

The signal lines SGL are connected to a circuit board. The signal lines SGL are connected to an integrated chip-type timing control circuit mounted to the circuit board.

The data lines DL include three types of data lines. A first-type data line DL1 is connected to all pixels arranged in a corresponding pixel column. The first-type data line DL1 is far from the hole region HA. A second-type data line DL2 is connected to all pixels arranged in a corresponding pixel column and is located adjacent to the hole region HA. In addition, the second-type data line DL2 is connected to some pixels in another pixel column adjacent to the corresponding pixel column. A portion of the second-type data line DL2 extends along the hole region HA. A third-type data line DL3 is connected to some pixels arranged in a corresponding pixel column and is shorter than the first-type data line DLA. An end of the third-type data line DL3 is located adjacent to the hole region HA.

Figure 5A:
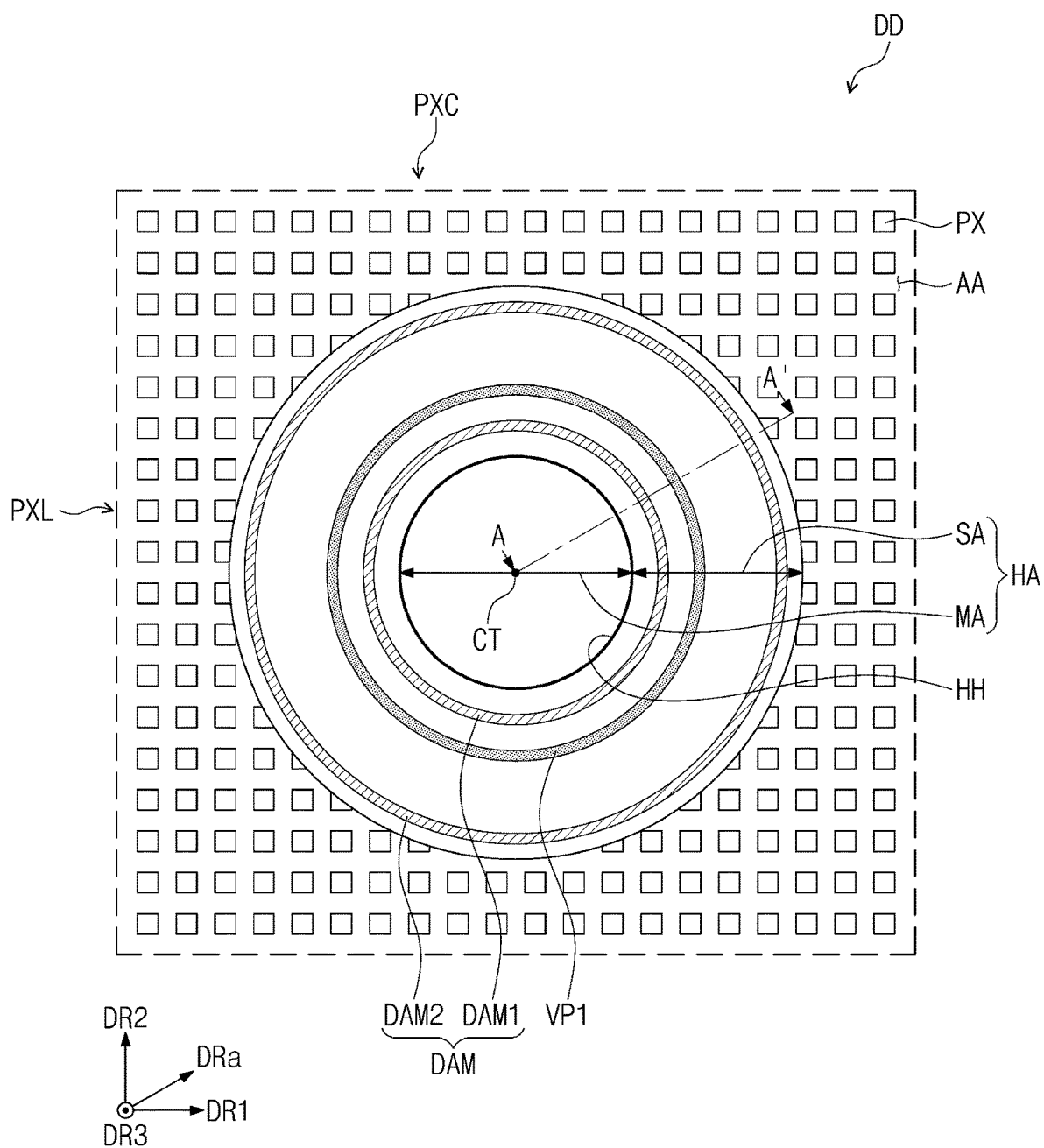
FIG. 5A is an enlarged plan view of a portion of a display device according to an embodiment of the inventive concept.
Figure 5B:
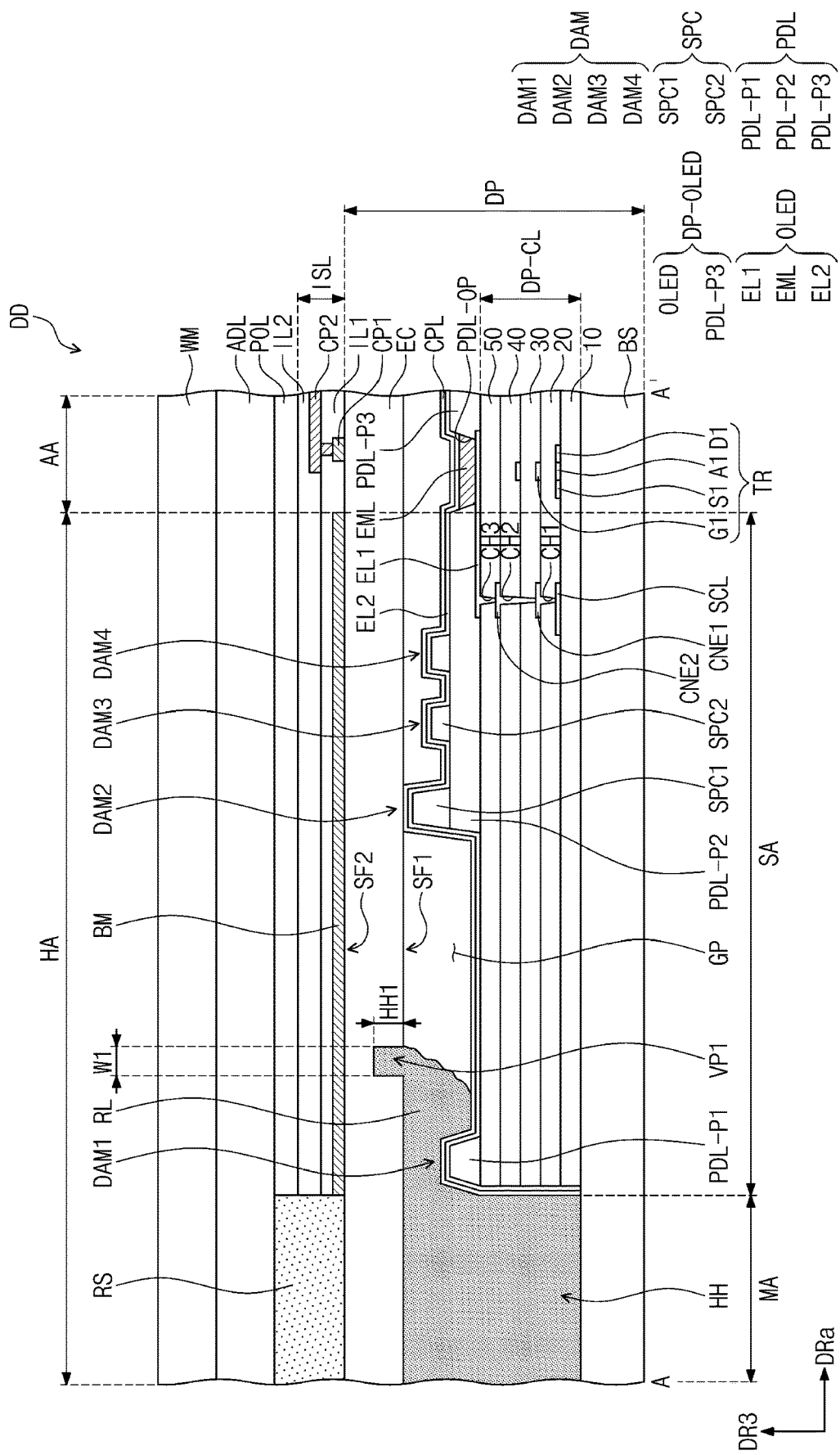
FIG. 5B is a cross-sectional view of a display device according to an embodiment of the inventive concept.

FIG. 5A is an enlarged plan view of a portion of a display device according to an embodiment of the inventive concept. FIG. 5B is a cross-sectional view of a display device according to an embodiment of the inventive concept.

FIG. 5A illustrates a hole region HA and a portion of a display region AA around the hole region HA. FIG. 5B is a cross-section taken along line A-A' of FIG. 5A. Hereinafter, the extension direction of cutting line A-A' is referred to as a direction DRa.

Referring to FIG. 5A, in an embodiment, pixels PX are arranged in the display region AA. The pixels PX arranged in a second direction DR2 define a pixel row PXL, and the pixels PX arranged in a first direction DR1 define a pixel column PXC. A portion of the pixel rows PXL and a portion of pixel columns PXC are disconnected by the hole region HA.

Referring to FIG. 5A, in a display panel DP according to an embodiment, a hole HH is formed in the hole region HA. In an embodiment, the hole HH is recessed from an upper component of the display panel DP. For example, as illustrated in FIG. 5B, the hole HH is an opening that extends from the upper surface of a light emitting element layer DP-OLED in the display panel DP to the upper surface of a base layer BS. The upper surface of the base layer BS is exposed by the hole HH, and a light compensation layer RL is in contact with the exposed upper surface of the base layer BS. However, embodiments of the inventive concept are not necessarily limited thereto, and in some embodiments, the hole HH extends from the upper surface of the light emitting element layer DP-OLED to at least a portion of a circuit layer DP-CL. In an embodiment, no separate opening or groove that corresponds to the hole HH is formed in the base layer BS. However, embodiments of the inventive concept are not necessarily limited thereto, and in some embodiments, an opening or a groove is formed in the base layer BS. When an opening that corresponds to the hole HH is formed in the base layer BS, the hole HH of the display panel DP is a through-hole that passes through the entire display panel DP.

In an embodiment, the hole HH may have a circular shape with a hole center CT. The hole HH has a constant radius with respect to the hole center CT when viewed in a plan view. However, embodiments of the inventive concept are not necessarily limited thereto, and in some embodiments, the hole HH has a polygonal shape. In addition, a plurality of holes HH may be provided.

No pixels PX are provided in the hole region HA. The hole region HA includes a signal transmission region MA and a peripheral region SA adjacent to the signal transmission region MA. The signal transmission region MA corresponds to the hole HH. The peripheral region SA surrounds the signal transmission region MA. The peripheral region SA is defined between the signal transmission region MA and the display region AA.

A dam DAM and a groove pattern VP1 that surround the hole HH are arranged in the peripheral region SA. The groove pattern VP1 is formed in an encapsulation substrate EC. For example, the groove pattern VP1 is recessed from one surface of the encapsulation substrate EC. FIG. 5A illustrates an arrangement relationship between the groove pattern VP1 and the dam DAM.

In an embodiment, each of the dam DAM and the groove pattern VP1 has a closed curved shape located along the circumference of the hole HH. Each of the dam DAM and the groove pattern VP1 has an annular shape i with a constant radius with respect to the hole center CT when viewed in a plan view. The dam DAM and the groove pattern VP1 control a flow of the light compensation layer RL disposed in the hole HH. As each of the dam DAM and the groove pattern VP1 has a closed curved shape, a fluid that fills the hole RH and forms the light compensation layer RL is prevented from flowing into the display region AA beyond the peripheral region SA.

In the display panel DP according to an embodiment, a plurality of dams DAM are provided. The dams DAM include a first dam DAM1 and a second dam DAM2. The first dam DAM1 is located closer to the hole HH than the second dam DAM2. When viewed in a plan view, the distance from the hole center CT to the second dam DAM2 is greater than the distance from the hole center CT to the first dam DAM1. Each of the first dam DAM1 and the second dam DAM2 has a close curves shape that surrounds the hole HH and is located along the circumference of the hole HH. Each of the first dam DAM1 and the second dam DAM2 has an annular shape with a constant radius with respect to the hole center CT.

Among the plurality of dams DAM, the first dam DAM1 is the closest dam to the hole center CT. Among the plurality of dams DAM, the second dam DAM2 is the next-closest dam to the hole center CT. When three or more dams DAM are provided, the first dam DAM1 is located closest to the hole center CT, and the other dams have a closed curved shape with a radius greater than that of the first dam DAM1.

The groove pattern VP1 is located between the first dam DAM1 and the second dam DAM2. The groove pattern VP1 is located closer to the display region AA than the first dam DAM1. The second dam DAM2 is located closer to the display region AA than the groove pattern VP1.

When the groove pattern VP1 has a closed curved shape, the groove pattern VP1 has a radius with respect to the hole center CT that is greater than that of the first dam DAM1.

FIG. 5A shows that the dam DAM includes the first dam DAM1 and the second dam DAM2, but this is a portion thereof. Additional dams DAM will be described in detail with reference to FIG. 5B.

Referring to FIG. 5B, in an embodiment, the display device DD include a display panel DP, an input sensor ISL, an optical film POL, and a window WM. An adhesive layer ADL is located between the optical film POL and the window WM. However, embodiments of the inventive concept are not necessarily limited thereto, and in an embodiment, an adhesive layer is also located between the display panel DP and the input sensor ISL.

The display panel DP includes a base layer BS, a circuit layer DP-CL, a light emitting element layer DP-OLED, a capping layer CPL, and an encapsulation substrate FC.

The circuit layer DP-CL is disposed on the base layer BS. In an embodiment, the circuit layer DP-CL includes a plurality of insulating layers. The plurality of insulating layers include a first insulating layer 10, a second insulating layer 20, a third insulating layer 30, a fourth insulating layer 40, and a fifth insulating layer 50. Each of the first to fifth insulating layers 10, 20, 30, 40, and 50 may include an inorganic material or an organic material.

The first insulating layer 10 is a buffer layer. The first insulating layer 10 enhances a coupling strength between the base layer BS and a semiconductor pattern. The first insulating layer 10 includes an inorganic layer, such as at least one of a silicon oxide layer, a silicon nitride layer, or a silicon oxynitride layer. For example, the first insulating layer 10 is formed by alternately stacking two or more of a silicon oxide layer, a silicon nitride layer, and a silicon oxynitride layer.

The semiconductor pattern is disposed on the first insulating layer 10. The semiconductor pattern includes polysilicon. However, embodiments of the inventive concept are not necessarily limited thereto, and in some embodiments, the semiconductor pattern includes amorphous silicon or a metal oxide.

Only a portion of the semiconductor pattern is illustrated in FIG. 5B, and another portion of the semiconductor pattern is located in other regions. The semiconductor pattern has a specific arrangement over the pixels. The semiconductor pattern has different electrical properties depending on whether the semiconductor pattern is doped or not. The semiconductor pattern includes a first region that has high conductivity and a second region that has low conductivity. The first region is doped with an N-type dopant or a P-type dopant. The second region is a channel region.

The electrical conductivity of the first region is greater than that of the second region and may substantially serve as an electrode or a signal line. The second region may substantially correspond to an active region or a channel of a transistor. For example, a portion of the semiconductor pattern may be the active region of the transistor, another portion thereof may be a source or a drain of the transistor, and the other portion thereof may be a connection electrode or a connection signal line.

FIG. 5B illustratively shows one transistor TR and the light emitting element OLED in the pixel.

A source S1, an active A1, and a drain D1 of the transistor TR are formed from the semiconductor pattern. The source S1 and the drain D1 extend from the active A1 in opposite directions. A portion of a connection signal line SCL formed from the semiconductor pattern is illustrated in FIG. 5B. The connection signal line SCL is electrically connected to the drain D1 of the transistor TR when viewed in a plan view.

The second insulating layer 20 is disposed on the first insulating layer 10. The second insulating layer 20 overlaps a plurality of pixels in common and covers the semiconductor pattern. The second insulating layer 20 may be an inorganic layer and/or an organic layer and may have a single- or multi-layered structure. The second insulating layer 20 includes at least one of an aluminum oxide, a titanium oxide, a silicon oxide, a silicon nitride, or a silicon oxynitride. In an embodiment, the second insulating layer 20 is a single-layered silicon oxide layer. An insulating layer of the circuit layer DP-CL, which will be described below, as well as the second insulating layer 20 may be an inorganic layer and/or an organic layer, and may have a single- or a multi-layered structure. The inorganic layer includes at least one of the materials described above, although embodiments of the inventive concept are not necessarily limited thereto.

The gate G1 of the transistor TR is disposed on the second insulating layer 20. The gate G1 is a portion of a metal pattern. The gate G1 overlaps with the active A1. During a process of doping the semiconductor pattern, the gate G1 functions as a mask.

A first connection electrode CNE1 is disposed on the second insulating layer 20. The first connection electrode CNE1 is connected to the connection signal line SCL through a first contact hole CH1 that penetrates through the second insulating layer 20.

The third insulating layer 30 is disposed on the second insulation layer 20 and covers the gate G1 and the first connection electrode CNEL. The third insulating layer 30 overlaps with pixels in common. The third insulating layer 30 may be an inorganic layer and/or an organic layer and may have a single- or a multi-layered structure that includes at least one of a silicon oxide layer, a silicon nitride layer, or a silicon oxynitride layer.

The fourth insulating layer 40 is disposed on the third insulating layer 30 and may have a single- or a multi-layered structure that includes at least one of a silicon oxide layer, a silicon nitride layer, or a silicon oxynitride layer.

A second connection electrode CNE2 is disposed on the fourth insulating layer 40. The second connection electrode CNE2 is connected to the first connection electrode CNE1 through a second contact hole CH2 that penetrates through the third insulating layer 30 and the fourth insulating layer 40.

The fifth insulating layer 50 is disposed on the fourth insulating layer 40 and covers the second connection electrode CNE2. The fifth insulating layer 50 is an organic layer.

The light emitting element layer DP-OLED is disposed on the circuit layer DP-CL. The light emitting element layer DP-OLED is disposed on the uppermost insulating layer of the circuit layer DP-CL.

The light emitting element layer DP-OLED includes a light emitting element OLED and a pixel defining layer PDL. The light emitting element OLED include a first electrode EL1, a light emitting organic layer EML disposed on the first electrode EL1, and a second electrode EL2 disposed on the light emitting organic layer EML. The first electrode EL1 is disposed on the fifth insulating layer 50. The first electrode EL1 is connected to the second connection electrode CNE2 through a third contact hole CH3 that penetrates through the fifth insulating layer 50.

The light emitting organic layer EML includes a hole transport layer, a light emitting layer, and an electron transport layer. The light emitting organic layer EML further includes a hole control layer, a hole injection layer, an electron control layer, and an electron transport layer. The light emitting layer includes an organic material and/or an inorganic material, and generates light having a predetermined color. For example, the light emitting layer may include an organic light emitting material or may include a quantum-dot material. The light emitting layer emits light of at least one of blue, red, or green light. In addition, the light emitting layer may emit while light.

At least a portion of the first electrode EL1 is exposed by a pixel opening PDL-OP defined in the pixel defining layer PDL. The pixel defining layer PDL is disposed directly on the uppermost insulating layer of the circuit layer DP-CL.

For example, as illustrated in FIG. 5B, the pixel defining layer PDL is disposed directly on the fifth insulating layer 50.

The pixel defining layer PDL is divided into a plurality of sections that are spaced apart from each other. The pixel defining layer PDL includes a first section PDL-P1 included in a first dam DAM1, a second section PDL-P2 included in second to fourth dams DAM2, DAM3, and DAM4, and a third section PDL-P3 spaced apart from the second section PDL-P2 with the light emitting element OLED therebetween. The second section PDL-P2 and the third section PDL-P3 are spaced apart from each other by the pixel opening PDL-OP.

The first section PDL-P1 and the second section PDL-P2 of the pixel defining layer PDL are disposed in the peripheral region SA. The third section PDL-P3 of the pixel defining layer PDL is located in the display region AA.

The capping layer CPL is disposed on the light emitting element layer DP-OLED. The capping layer CPL is disposed on the second electrode EL2 and is in contact with the second electrode EL2. The capping layer CPL includes an organic material. The capping layer CPL protects the second electrode EL2 against a subsequent process, such as a sputtering process, and increases light emitting efficiency of the light emitting element OLED. The refractive index of the capping layer CPL is about 1.6 or more. Specifically, the refractive index of the capping layer CPL is greater than or equal to about 1.6 with respect to the light in a wavelength range of about 550 nm to about 660 nm. However, in an embodiment, the capping layer CPL is omitted. When the capping layer CPL is omitted, no other component is disposed on the second electrode EL2, and a gap GP is formed thereon.

The display panel DP includes the dam DAM. The dam DAM overlaps the peripheral region SA above the base layer BS. The dam DAM includes a plurality of insulating layers. The dam DAM controls a flow of the light compensation layer RL. FIG. 5B shows that four dams DAM1, DAM2, DAM3 and DAM4 are provided, but embodiments of the inventive concept are not necessarily limited thereto. In some embodiments, the number of the dams DAM is two, three, or five or more. In an embodiment, the display panel DP includes a first dam DAM1, a second dam DAM2, a third dam DAM3, and a fourth dam DAM4. The first to fourth dams DAM1, DAM2, DAM3, and DAM4 control the flow of the light compensation layer RL.

The first dam DAM1 has a structure in which a plurality of layers are stacked. For example, the first dam DAM1 is formed through the same process as the insulating layers 10 to 50 of the circuit layer DP-CL and the pixel defining layer PDL. The first dam DAM1 is formed by the first section PDL-P1 of the pixel defining layer PDL and the plurality of insulating layers 10 to 50 of the circuit layer DP-CL disposed below the first section PDL-P1.

The second dam DAM2 has a structure in which a plurality of layers are stacked. For example, the second dam DAM2 is formed through the same process as the insulating layers 10 to 50 of the circuit layer DP-CL, the pixel defining layer PDL, and a first spacer SPC1.

The second dam DAM2 is formed by the first spacer SPC1, the second section PDL-P2 of the pixel defining layer PDL, and the plurality of insulating layers 10 to 50 of the circuit layer DP-CL disposed below the first spacer SPC1 and the second section PDL-P2. The first spacer SPC1 is disposed on the pixel defining layer PDL and includes an organic material. The second dam DAM2 includes the first spacer SPC1 and is in contact with the encapsulation substrate EC. The second dam DAM2 maintains a gap GP between the encapsulation substrate EC and components below a spacer SPC.

The second dam DAM2 includes the first spacer SPC1 and thus has a height greater than that of the first dam DAM1. In an embodiment, the first dam DAM1 includes only the first section PDL-P1 and does not include a spacer. However, the second dam DAM2 includes the second section PDL-P2 and the first spacer SPC1 disposed on the second section PDL-P2, and thus is higher than the first dam DAM1.

The third dam DAM3 has a structure in which a plurality of layers are stacked. For example, the third dam DAM3 is formed through the same process as the insulating layers 10 to 50 of the circuit layer DP-CL, the pixel defining layer PDL, and includes a second spacer SPC2. The third dam DAM3 is formed by the second spacer SPC2, the second section PDL-P2 of the pixel defining layer PDL, and the plurality of insulating layers 10 to 50 of the circuit layer DP-CL disposed below the second spacer SPC2 and the second section PDL-P2. The second spacer SPC2 is disposed on the pixel defining layer PDL and includes an organic material. The second spacer SPC2 has a height that is less than that of the first spacer SPC1. The third dam DAM3 includes the second spacer SPC2, and thus has a height greater than the first dam DAM1 and less than the second dam DAM2.

The fourth dam DAM4 has a structure in which a plurality of layers are stacked. For example, the fourth dam DAM4 is formed through the same process as the insulating layers 10 to 50 of the circuit layer DP-CL, the pixel defining layer PDL, and the second spacer SPC2. The fourth dam DAM4 is formed by the second spacer SPC2, the second section PDL-P2 of the pixel defining layer PDL, and the plurality of insulating layers 10 to 50 of the circuit layer DP-CL disposed below the second spacer SPC2 and the second section PDL-P2. The fourth dam DAM4 includes the second spacer SPC2, and thus has a height greater than the first dam DAM1 and less than the second dam DAM2. FIG. 5B shows that the third dam DAM3 and the fourth dam DAM4 have the same height, but embodiments of the inventive concept are not necessarily limited thereto. In an embodiment, heights of the third dam DAM3 and the fourth dam DAM4 differ.

The encapsulation substrate EC is disposed on the first to fourth dams DAM1, DAM2, DAM3, and DAM4.

The light compensation layer RL is disposed between the encapsulation substrate EC and the base layer BS. The display panel DP according to an embodiment includes the light compensation layer RL that overlaps the hole HH. The light compensation layer RL adjusts transmittance of the signal transmission region MA and prevents a multiple reflection interference (MRI) phenomenon. The light compensation layer RL is disposed on the base layer BS and the capping layer CPL.

The light compensation layer RL overlaps a portion of the hole region HA. The light compensation layer RL overlaps at least the signal transmission region MA and overlaps a portion of the peripheral region SA. The light compensation layer RL does not overlap the display region AA. For example, the entire surface of the light compensation layer RL overlaps the signal transmission region MA.

The encapsulation substrate EC is disposed on the light compensation layer RL. The light compensation layer RL is in contact with the lower surface of the encapsulation substrate EC. The gap GP between the encapsulation substrate EC and the light compensation layer RL or between the encapsulation substrate EC and the capping layer CPL is in a vacuum state. In addition, the base layer BS, the light compensation layer RL, and the encapsulation substrate EC are sequentially disposed in the signal transmission region MA, and no other component is disposed between the base layer BS, the light compensation layer RL, and the encapsulation substrate EC. In the signal transmission region MA according to an embodiment, only the base layer BS, the light compensation layer RL, and the encapsulation substrate EC, which are optically transparent, are sequentially disposed, and thus the transmittance of an optical signal output from the electronic module ELM (FIG. 2) that overlaps the hole HH or transmittance of an optical signal that enters the electronic module ELM (FIG. 2) is increased.

In an embodiment, the light compensation layer RL is formed by hardening a viscous fluid. For example, the light compensation layer RL is formed by hardening a liquid-phase silicon (Si)-based material. However, embodiments of the inventive concept are not necessarily limited thereto, and in an embodiment, the light compensation layer RL is formed by hardening an organic material. For example, the fluid is provided in the hole HH between the encapsulation substrate EC and the display panel DP, and then the fluid flows out from the hole HH toward the peripheral region SA as the encapsulation substrate EC is pressed against the display panel DP. The fluid hardens while flowing from the hole HH toward the peripheral region SA, and the light compensation layer RL is formed by the hardened fluid. The light compensation layer RL is in contact with at least a portion of the first dam DAM1.

The groove pattern VP1 is formed in the encapsulation substrate EC. The groove pattern VP1 is located in the hole region HA but not in the display region AA. For example, the groove pattern VP1 overlaps the peripheral region SA. The groove pattern VP1 is located adjacent to the hole HE and surrounds the hole HH. The groove pattern VP1 is located between the first dam DAM1 and the second dam DAM2.

Accordingly, even if the fluid that forms the light compensation layer RL flows over the first dam DAM1, the overflowing fluid can fill the groove pattern VP1. Thus, the fluid is prevented from flowing into the display region AA.

The display device DD according to an embodiment of the inventive concept includes the groove pattern VP1 formed in the encapsulation substrate EC. Thus, without increasing the width of the peripheral region SA, a volume of the light compensation layer RL that can be accommodated in the peripheral region SA is increased. Accordingly, when the light compensation layer RL is formed, a sufficient amount of organic material fills the hole HH and prevents the hole HH from not being filled with the light compensation layer RL. In addition, the volume of the light compensation layer RL that can be accommodated in the peripheral region SA increases, and thus the fluid that fills the hole HH when the light compensation layer RL is formed is prevented from escaping the peripheral region SA and then flowing into the display region AA. The display device DD according to an embodiment of the inventive concept prevents the light compensation layer RL from flowing into the display region AA. Thus, occurrence of defects in the light emitting element OLED, hereinafter referred to as a pixel defect, can be prevented.

The display device DD according to an embodiment of the inventive concept includes the groove pattern VP1 formed in the encapsulation substrate EC. Thus, without increasing a dead space of the display device DD, the flow of the light compensation layer RL can be controlled and defects in the display device DD can be prevented. Thus, the reliability of the display device DD is increased.

The groove pattern VP1 may have a shape recessed from one surface of the encapsulation substrate EC. The encapsulation substrate EC includes a first surface SF1 and a second surface SF2 that face each other. The first surface SF1 and the second surface SF2 correspond to the lower surface and the upper surface of the encapsulation substrate EC, respectively.

The groove pattern VP1 is formed on the first surface SF1. For example, the groove pattern VP1 may have a shape recessed from the first surface SF1 toward the second surface SF2. In an embodiment, the groove pattern VP1 has a first width W1 in an a direction DRa and is recessed to a first depth h in a third direction DR3. In an embodiment, the first width W1 ranges from several tens of micrometers to several hundred micrometers. The first depth HH1 is less than the thickness of the encapsulation substrate EC. In an embodiment, the first depth HH1 ranges from several tens of micrometers to several hundred micrometers.

FIG. 5B shows, as an example, that even the groove pattern VP1 is filled with the light compensation layer RL, but embodiments of the inventive concept are not necessarily limited thereto. In an embodiment, one end of the light compensation layer RL is located between the signal transmission region MA and the groove pattern VP1, and the groove pattern VP1 is not filled with the light compensation layer RL. In an embodiment, one end of the light compensation layer RL is located between the groove pattern VP1 and the second dam DAM2, and the entire groove pattern VP1 is filled with the light compensation layer RL.

A planarization layer RS, an input sensor ISL, an optical film POL, and a window WM are disposed on the encapsulation substrate EC. In an embodiment, an adhesive layer ADL is located between the optical film POL and the window WM. The adhesive layer ADL may be an optically clear adhesive or an optically clear resin.

The planarization layer RS is located in the same layer as the input sensor ISL and the optical film POL. The planarization layer RS is optically transparent. The planarization layer RS is made of an organic material. The planarization layer RS overlaps the signal transmission region MA, and each of the input sensor ISL and the optical film POL overlaps the peripheral region SA and the display region AA.

In the signal transmission region MA according to an embodiment, only the base layer BS, the light compensation layer RL, the encapsulation substrate EC, the planarization layer RS, the adhesive layer ADL, and the window WM, which are optically transparent, are sequentially disposed, and thus transmittance of an optical signal output from the electronic module ELM (see FIG. 2) that overlaps the hole HH or transmittance of an optical signal that enters the electronic module ELM (see FIG. 2) can be increased.

The input sensor ISL is disposed on the encapsulation substrate EC. The input sensor ISL includes at least one conductive layer and at least one insulating layer. For example, the input sensor ISL includes a first conductive layer CP1 and a cover pattern BM that are disposed on the encapsulation substrate EC, a first input insulating layer IL1 that covers the first conductive layer CP1 and the cover pattern BM, a second conductive layer CP2 disposed on the first input insulating layer IL1, and a second input insulating layer IL2 disposed on the first input insulating layer IL1 and that covers the second conductive layer CP2. The second conductive layer CP2 is connected to the first conductive layer CP1 by penetrating through the first input insulating layer IL1.

In an embodiment, each of the first and second input insulating layers IL1 and IL2 is an inorganic layer that includes one of a silicon nitride, a silicon oxynitride, or a silicon oxide. In an embodiment, each of the first and second input insulating layers IL1 and IL2 is an organic layer that includes an epoxy resin, an acrylic resin, or an imide-based resin.

Each of the first conductive layer CP1 and the second conductive layer CP2 may have a single-layered structure or a multi-layered structure in which layers are stacked in a third direction DR3. The single-layered first and second conductive layers CP1 and CP2 include a metal layer or a transparent conductive layer. The metal layer includes at least one of molybdenum, silver, titanium, copper, aluminum, or an alloy thereof. The transparent conductive layer includes a transparent conductive oxide such as at least one of an indium tin oxide (ITO), an indium zinc oxide (IZO), a zinc oxide (ZnO), or an indium zinc tin oxide (IZTO). In addition, the transparent conductive layer may include a conductive polymer such as PEDOT, a metal nanowire, graphene, etc.

The multi-layered first and second conductive layers CP1 and CP2 include metal layers. The metal layers include, for example, a three-layered structure of titanium (Ti)/aluminum (Al)/titanium (Ti). The multi-layered first and second conductive layers CP1 and CP2 include at least one metal layer and at least one transparent conductive layer.

The cover pattern BM overlaps the peripheral region SA, and in particular, overlaps the groove pattern VP1 and the first to fourth dams DAM1, DAM2, DAM3, and DAM4. The cover pattern BM is formed through the same process as the first conductive layer CP1. An embodiment includes the cover pattern BM, and thus structures located in the peripheral region SA are prevented from being externally viewed.

The optical film POL and the window WM are the same as those described with reference to FIG. 2.

Figure 6A:
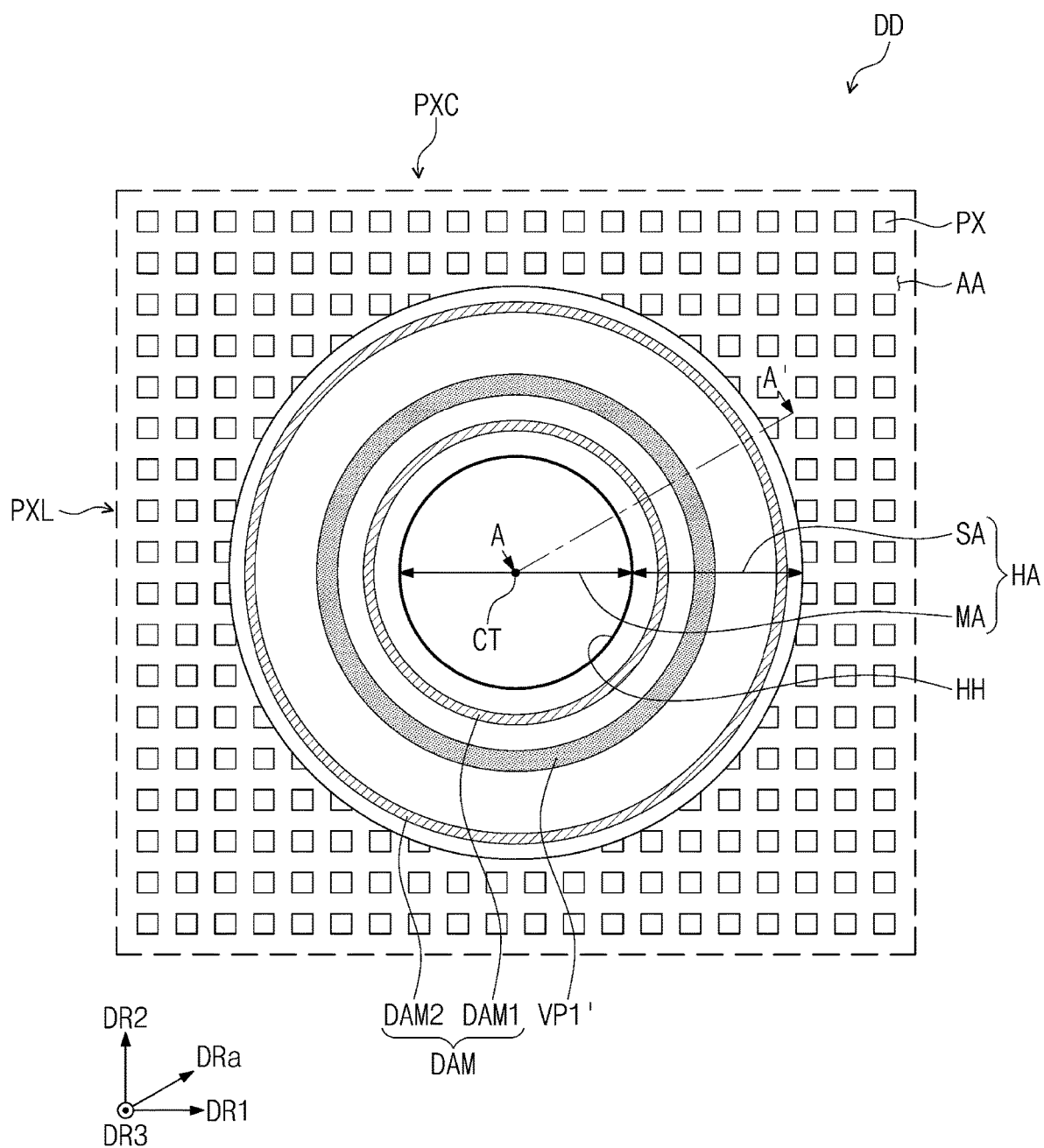
FIG. 6A is an enlarged plan view of a portion of a display device according to an embodiment of the inventive concept.
Figure 6B:
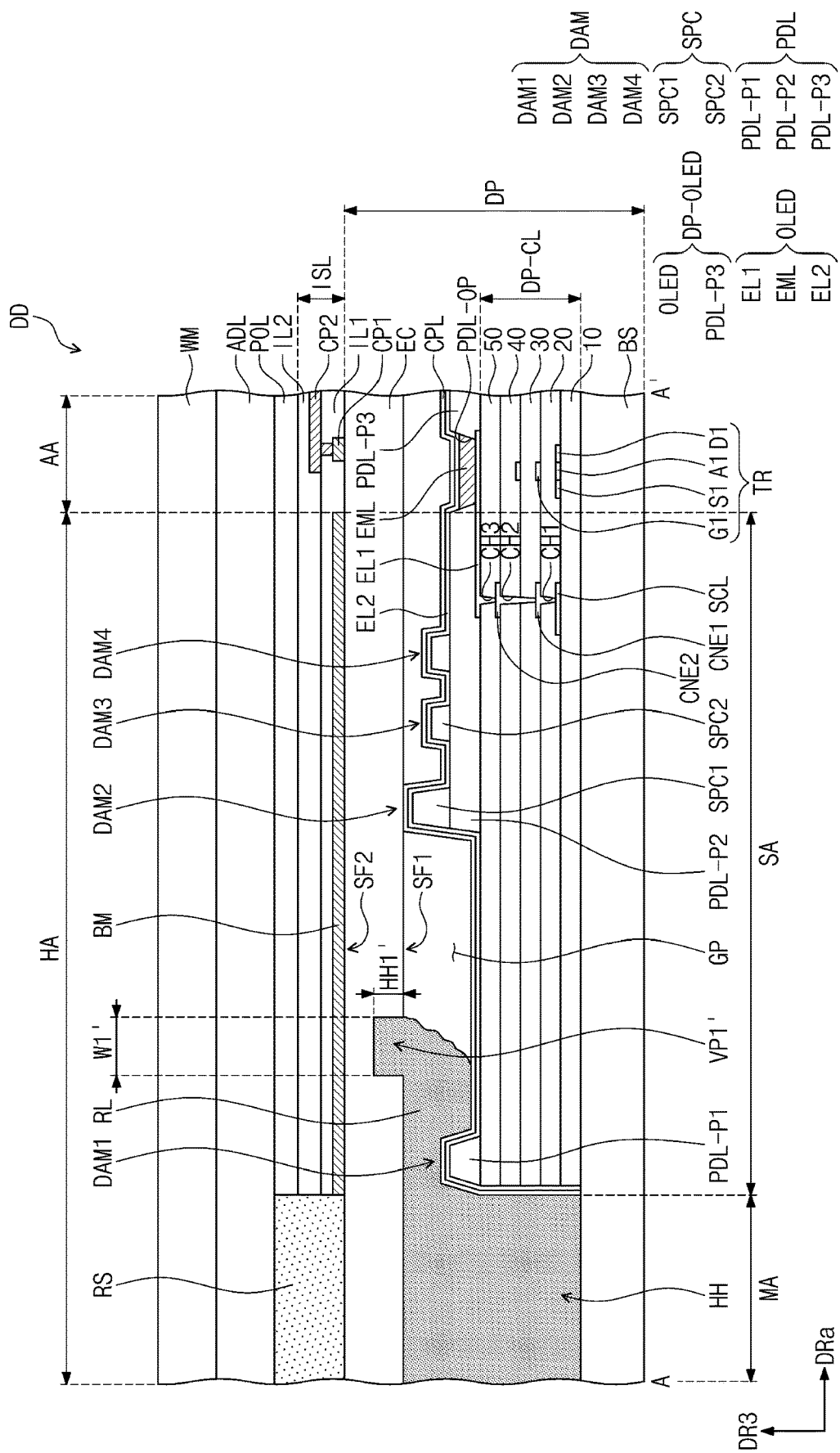
FIG. 6B is a cross-sectional view of a display device according to an embodiment of the inventive concept.

FIG. 6A is an enlarged plan view of a portion of a display device according to an embodiment of the inventive concept. FIG. 6B is a cross-sectional view of a display device according to an embodiment of the inventive concept. Hereinafter, detailed descriptions of components that are the same as those described with reference to FIGS. 5A and 5B may be summarized or omitted.

Referring to FIGS. 6A and 68, in an embodiment, a groove pattern VP1' is formed in an encapsulation substrate EC. A width W1' of the groove pattern VP1' is two times the width W1 of the groove pattern VP described above in FIGS. 5A and 5B. Accordingly, the volume of a light compensation layer RL that can be accommodated in a peripheral region SA further increases. FIG. 6B shows that a depth HH1' of the groove pattern VP1' is equal to the depth HH1 of the first groove pattern VP1 described above in FIG. 5B, but embodiments of the inventive concept are not necessarily limited thereto.

A display device DD according to an embodiment of the inventive concept includes the groove pattern VP1' formed in the encapsulation substrate EC. Thus, without increasing the width of the peripheral region SA, the volume of the light compensation layer RL that can be accommodated in the peripheral region SA can be increased. Accordingly, the flow of the light compensation layer RL can be controlled. In addition, a hole 11H is prevented from not being filled with the light compensation layer RL, or the light compensation layer RL is prevented from flowing into a display region AA.

Figure 7A:
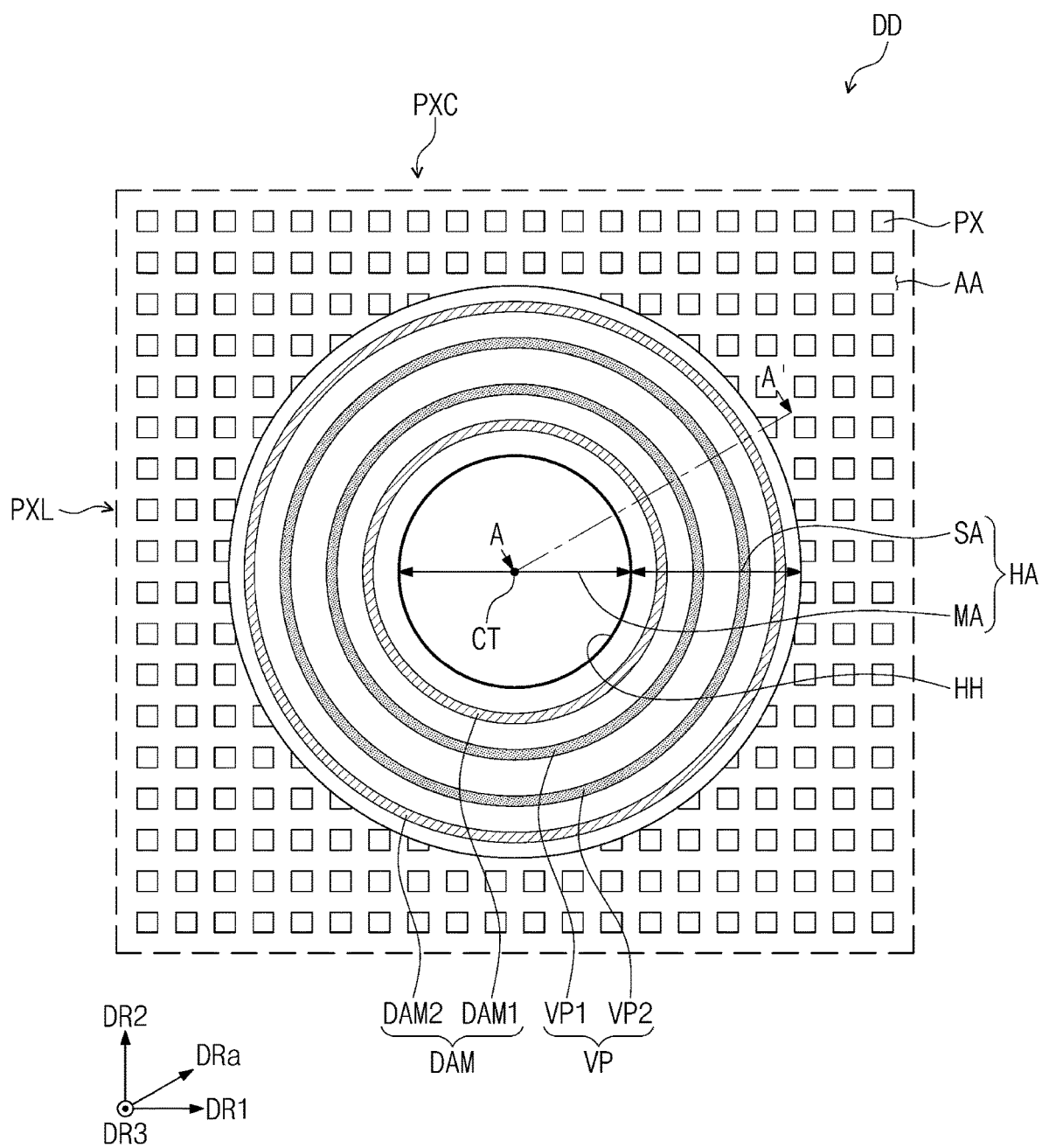
FIG. 7A is an enlarged plan view of a portion of a display device according to an embodiment of the inventive concept.
Figure 7B:
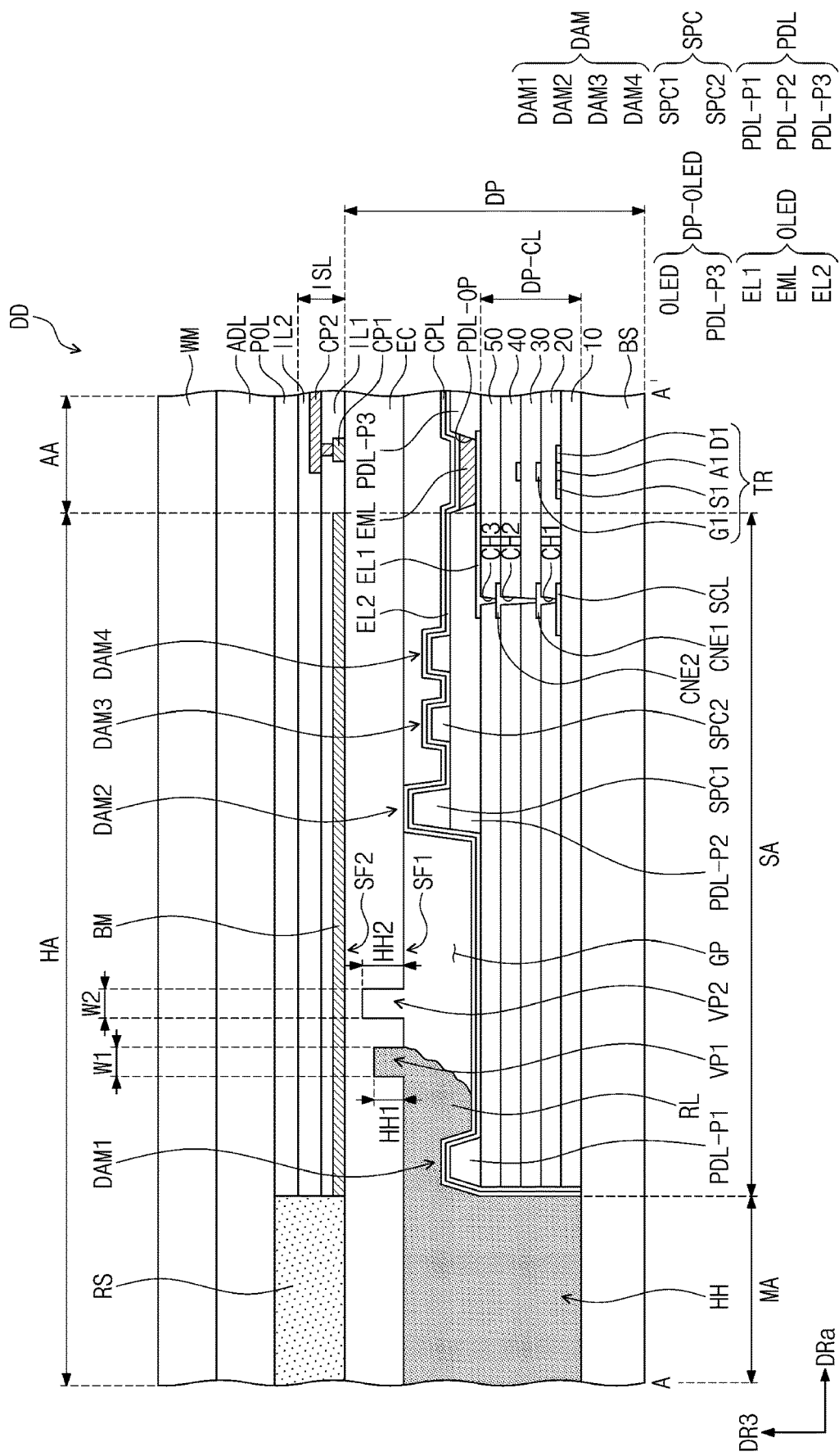
FIG. 7B is a cross-sectional view of a display device according to an embodiment of the inventive concept.

FIG. 7A is an enlarged plan view of a portion of a display device according to an embodiment of the inventive concept. FIG. 7B is a cross-sectional view of a display device according to an embodiment of the inventive concept.

Referring to FIGS. 7A and 7B, in an embodiment, a first groove pattern VP1 and a second groove pattern VP2 are formed in an encapsulation substrate EC. Each of the first groove pattern VP1 and the second groove pattern VP2 is located between a first dam DAM1 and a second dam DAM2.

In an embodiment, the first groove pattern VP1 and the second groove pattern VP2 are spaced apart from each other, and each of the first groove pattern VP1 and the second groove pattern VP2 has a closed curved shape that surrounds a hole HH. A radius of the first groove pattern VP1 with respect to the hole center CT is less that a radius of the second groove pattern VP2 with respect to the hole center CT.

A description of the first groove pattern VP1 is substantially the same as the groove pattern VP1 described with reference to FIG. 5B. That is, the first groove pattern VP1 has a first width W1 in a direction DRa and is recessed to a first depth HH1 in a third direction DR3.

The second groove pattern VP2 may have a shape recessed from a first surface SF1. In an embodiment, the second groove pattern VP2 has a second width W2 in the direction Dra and is recessed to a second depth HH2 in the third direction DR3. In an embodiment, the second width W2 ranges from several tens of micrometers to several hundred micrometers. The second depth HH2 is greater than the first depth HH1 and less than the thickness of the encapsulation substrate EC. In an embodiment, the second depth HH2 ranges from several tens of micrometers to several hundred micrometers. FIG. 7B shows that the second depth HH2 is greater than the first depth HH1, but embodiments of the inventive concept are not necessarily limited thereto. In an embodiment, the second depth HH2 is less than the first depth HH1 or equal to the first depth HH1.

FIG. 7B shows that the second width W2 is equal to the first width W1, but embodiments of the inventive concept are not necessarily limited thereto. In an embodiment, the second width W2 is greater or less than the first width W1.

A display device DD according to an embodiment of the inventive concept includes the first groove pattern VP1 and the second groove pattern VP2. Thus, without increasing the width of a peripheral region SA, the volume of a light compensation layer RL that can be accommodated in the peripheral region SA can be increased. Accordingly, reliability of the display device DD is increased.

FIGS. 7A and 78 show that the first groove pattern VP1 and the second groove pattern VP2 are formed in the encapsulation substrate EC, but embodiments of the inventive concept are not necessarily limited thereto. In an embodiment, three or more groove patterns are formed in the encapsulation substrate EC.

Each of FIGS. 8 and 9 is an enlarged plan view of a portion of a display device according to an embodiment of the inventive concept.

Referring to FIGS. 8 and 9, in an embodiment, a plurality of groove patterns VP3 and VP4 are provided that are spaced apart from each other and surround a hole HH when viewed in a plan view. The plurality of groove patterns VP3 and VP4 are arranged between a first dam DAM1 and a second dam DAM2 and are distributed around the hole HH. FIG. 8 shows that each of the plurality of groove patterns VP3 has a circular shape. The plurality of groove patterns VP3 are arranged such that a first row thereof is adjacent to the first dam DAM1 and surrounds the hole HH and a second row thereof is adjacent to the second dam DAM2 and surrounds the hole HH and the first row. The distance from a hole center CT to the first row of the groove patterns VP3 is less than the distance from the hole center CT to the second row of the groove patterns VP3. The first row of the groove patterns VP3 and the second row of the groove patterns VP3 do not overlap each other on a cutting line AA'. However, embodiments of the inventive concept are not necessarily limited thereto.

FIG. 9 shows that each of the plurality of groove patterns VP4 has a rectangular shape. In addition, other features of the groove patterns VP4 are substantially the same as the groove patterns VP3 of FIG. 8, and a repeated description thereof is omitted.

Like the groove pattern VP1 illustrated in FIG. 5B, each of the groove patterns VP3 and VP4 illustrated in FIGS. 8 and 9 may have a shape recessed from the first surface SF1 (see FIG. 5) of the encapsulation substrate EC (see FIG. 5).

FIGS. 8 and 9 illustrate examples of groove patterns VP3 and VP4, but embodiments of the inventive concept are not necessarily limited thereto.

FIG. 10A is a plan view of a display device according to an embodiment of the inventive concept. FIG. 10B is a cross-sectional view of a display device according to an embodiment of the inventive concept.

Referring to FIG. 10A, a display device DD according to an embodiment of the inventive concept include an outer groove pattern OP1 located in a non-display region NAA. The outer groove pattern OP1 has a width W3 and surrounds a display region AA.

Referring to FIG. 10B, in an embodiment, the outer groove pattern OP1 is formed in an encapsulation substrate EC according to an embodiment. For example, the outer groove pattern OP1 overlaps the non-display region NAA and is formed on one surface of the encapsulation substrate EC. The outer groove pattern OP1 does not overlap with the display region AA but is located in the non-display region NAA.

A display panel DP includes an outer dam DAM-0. The outer dam DAM-0 includes a first outer dam DAM-01 located in the non-display region NAA and a second outer dam DAM-02 located in the display region AA. In an embodiment, the outer groove pattern OP1 is located between the first outer dam DAM-01 and the second outer dam DAM-02. However, embodiments of the inventive concept are not necessarily limited thereto, and in an embodiment, the first outer dam DAM-01 is located between the outer groove pattern OP1 and the second outer dam DAM-02.

The outer groove pattern OP is formed on a first surface SF1 of the encapsulation substrate EC. For example, the outer groove pattern OP1 may have a shape recessed from the first surface SF1 toward a second surface SF2. In an embodiment, the outer groove pattern OP1 has a third width W3 in a first direction DR1 and is recessed to a third depth HH3 in a third direction DR3. The third depth HH3 is less than the thickness of the encapsulation substrate EC. In an embodiment, the third depth HH3 ranges from several tens of micrometers to several hundred micrometers. In an embodiment, the third width W3 ranges from several tens of micrometers to several hundred micrometers.

The outer groove pattern OP1 is located in the non-display region NAA and does not overlap with the display region AA. The outer groove pattern OP1 surrounds the display region AA. Accordingly, even if a fluid that forms a light compensation layer RL-0 that will be described below flows over the second outer dam DAM-02, the overflowing fluid fills the outer groove pattern OPL. Thus, the fluid is prevented from flowing outside the non-display region NAA. In an embodiment, the second outer dam DAM-02 is omitted.

Each of the first outer dam DAM-01 and the second outer dam DAM-02 have a structure in which a plurality of layers are stacked. For example, the first outer dam DAM-01 is formed through the same process as insulating layers 10 to 50 of a circuit layer DP-CL and a pixel defining layer PDL. The first outer dam DAM-01 is formed by a fourth section PDL-P4 of the pixel defining layer PDL and the plurality of insulating layers 10 to 50 of the circuit layer DP-CL disposed below the fourth section PDL-P4. The second outer dam DAM-02 is formed through the same process as the insulating layers 10 to 50 of the circuit layer DP-CL, the pixel defining layer PDL, and a third spacer SPC3. The second outer dam DAM-02 is formed by the third spacer SPC3, a fifth section PDL-P5 of the pixel defining layer PDL, and the plurality of insulating layers 10 to 50 of the circuit layer DP-CL disposed below the third spacer SPC3 and the fifth section PDL-P5. The third spacer SPC3 is disposed on the pixel defining layer PDL and includes an organic material. For example, the third spacer SPC3 is disposed on the fifth section PDL-P5. The second outer dam DAM-02 includes the third spacer SPC3 and thus has a height that is greater than that of the first outer dam DAM-01. For example, the second outer dam DAM-02 is in contact with the encapsulation substrate EC and thus maintains a gap between the encapsulation substrate EC and components below the second outer dam DAM-02.

A filling layer RL-0 is disposed between the encapsulation substrate EC and a base layer BS. The filling layer RL-0 enhances optical clear performance of the display device DD, increases strength of the display device DD, or flattens the internal configuration of the display device DD. The filling layer RL-0 covers the entire surface of the display region AA.

In an embodiment, the filling layer RL-0 is formed by hardening a viscous fluid. The filling layer RL-0 is formed by hardening an organic material. For example, the fluid is provided in the display region AA between the encapsulation substrate EC and the display panel DP, which then flows from the display region AA toward the non-display region NAA as the encapsulation substrate EC is pressed against the display panel DP. The fluid is hardened while flowing from the display region AA toward the non-display region NAA, and the filling layer RL-0 is formed by the hardened fluid. The outer groove pattern OP1 prevents the fluid that forms the filling layer RL-0 from filling the display region AA and flowing outside the display device DD beyond the non-display region NAA.

The display device DD according to an embodiment of the inventive concept includes the outer groove pattern OP1 formed in the encapsulation substrate EC. Thus, without increasing the width of the non-display region NAA, the volume of the filling layer RL-0 that can be accommodated in the non-display region NAA between the encapsulation substrate EC and the dam DAM can be increased. Accordingly, the fluid that forms the filling layer RL-0 can harden inside non-display region NAA after sufficiently covering the entire surface of the display region AA. In addition, the fluid is prevented from flowing outside of the non-display region NAA.

In the display device DD according to an embodiment of the inventive concept, the display region AA is sufficiently covered with the filling layer RL-0. Thus, the display region AA is prevented from not being filled and the fluid that fills the entire display region AA is prevented from flowing out from the display device DD beyond the non-display region NAA.

FIG. 10B shows, as an example, that the outer groove pattern OP1 is filled with the filling layer RL-0, but embodiments of the inventive concept are not necessarily limited thereto. In an embodiment, one end of the filling layer RL-0 is located between the first outer dam DAM-01 and the outer groove pattern OP1. In an embodiment, one end of the filling layer RL-0 is located between the outer groove pattern OP1 and the second outer dam DAM-02, and the outer groove pattern OP1 is not filled with the filling layer RL-0.

An input sensor ISL disposed on the encapsulation substrate EC includes a cover pattern BM that overlaps with the non-display region NAA when viewed in a plan view. For example, the cover pattern BM overlaps the outer groove pattern OP when viewed in a plan view. Accordingly, structures located in the non-display region NAA and that include the outer groove pattern OP1 are prevented from being viewed from the outside of the display device DD.

In the display device DD according to an embodiment of the inventive concept, the outer groove pattern OP1 that overlaps the non-display region NAA is formed in the encapsulation substrate EC. Thus, the filling layer RL-0 that fills the display region AA is prevented from flowing out from the display device DD beyond the non-display region NAA.

Figure 11B:
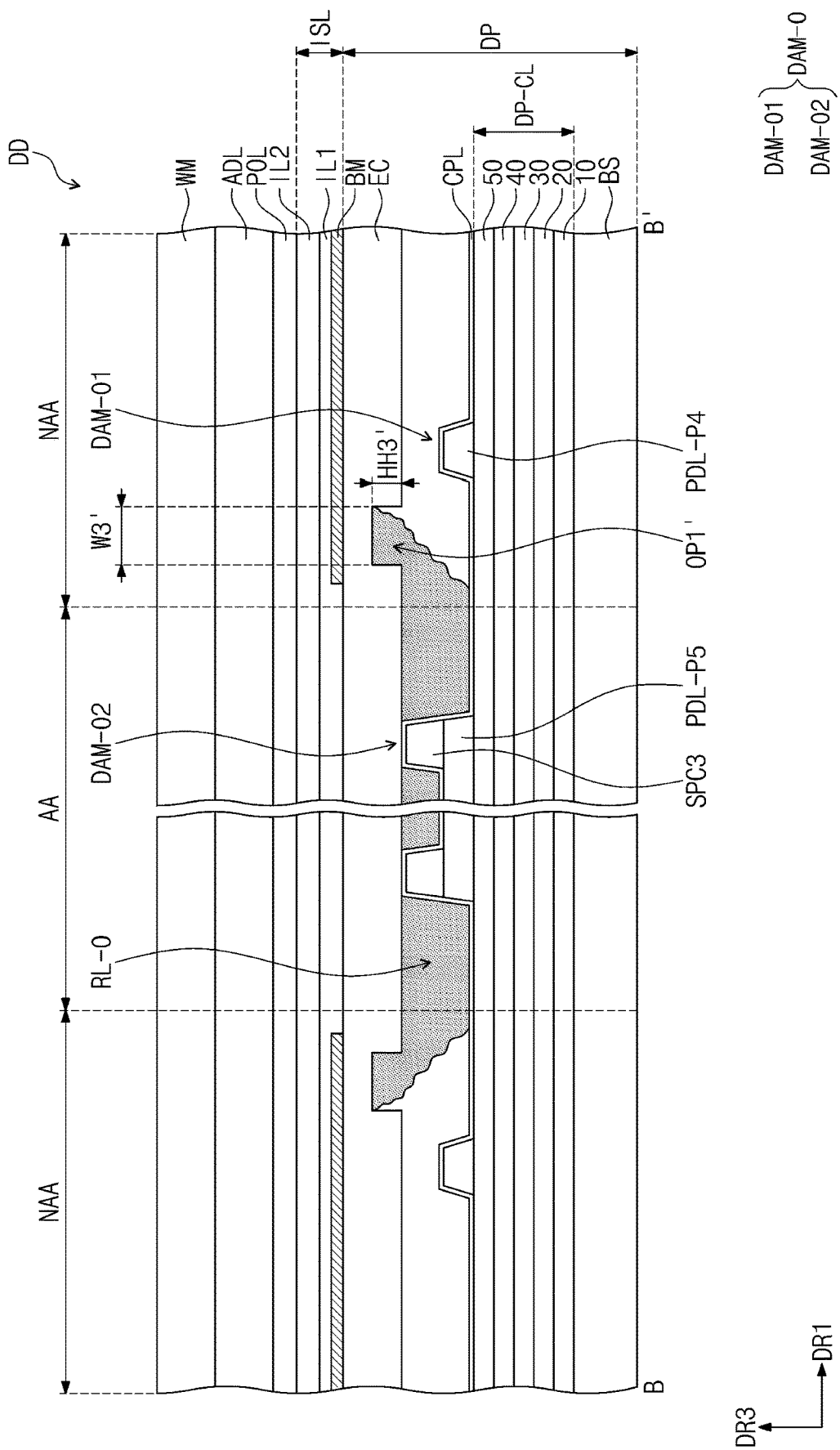

FIG. 11A is a plan view of a display device according to an embodiment of the inventive concept. FIG. 11B is a cross-sectional view of a display device according to an embodiment of the inventive concept. Hereinafter, detailed descriptions of components previously described with reference to FIGS. 10A and 10B may be summarized or omitted.

Referring to FIGS. 11A and 11B, in an embodiment, an outer groove pattern OP1' is formed in an encapsulation substrate EC. The outer groove pattern OP1' has a third width W3' and surrounds a display region AA. FIG. 11B shows that the third width W3' of the outer groove pattern OP1' is greater than the third width W3 of the outer groove pattern OP1 described above with reference to FIGS. 10A and 10B, but embodiments of the inventive concept are not necessarily limited thereto. In an embodiment, the third width W3' of the outer groove pattern OP1' is less than the third width W3 of the outer groove pattern OP1 described above with reference to FIG. 10A an 10B. As the third with W' increases, the volume of the filling layer RL-0 that can be accommodated in the non-display region NAA further increases. FIG. 11B shows that a third depth HH3' of the outer groove pattern OP1' is equal to the third depth HH3 of the outer groove pattern OP1 described above with reference to FIG. 10B, but embodiments of the inventive concept are not necessarily limited thereto.

FIG. 11B shows, as an example, that the outer groove pattern OP1' is filled with the filling layer RL-0, but embodiments of the inventive concept are not necessarily limited thereto. In an embodiment, one end of the filling layer RL-0 is located between a first outer dam DAM-01 and the outer groove pattern OP1'. In an embodiment, one end of the filling layer RL-0 is located between the outer groove pattern OP1' and a second outer dam DAM-02, and the outer groove pattern OP1' is not filled with the filling layer RL-0.

FIG. 12A is a plan view of a display device according to an embodiment of the inventive concept. FIG. 12B is a cross-sectional view of a display device according to an embodiment of the inventive concept.

Referring to FIGS. 12A and 12B, in an embodiment, a first outer groove pattern OP1, a second outer groove pattern OP2, and a third outer groove pattern OP3 are formed in an encapsulation substrate EC according to an embodiment. The first to third outer groove patterns OP1, OP2, and OP3 each have a fourth width W4, a fifth width W5, and a sixth width W6, respectively, and surround a display region AA.

Each of the first to third outer groove patterns OP1, OP2, and OP3 is located between a first outer dam DAM-01 and a second outer dam DAM-02.

The first to third outer groove patterns OP1, OP2, and OP3 are spaced apart from each other.

The third outer groove pattern OP3 surrounds the second outer groove pattern OP2, and the second outer groove pattern OP2 surrounds the first outer groove pattern OP1.

The first outer groove pattern OP1 has the fourth width W4 in a first direction DR1 and is recessed to a fourth depth HH4 in a third direction DR3.

The second outer groove pattern OP2 has the fifth width W5 in the first direction DR1 and is recessed to the fourth depth HH4 in the third direction DR3.

The third outer groove pattern OP3 has the sixth width W6 in the first direction DR1 and is recessed to the fourth depth HH4 in the third direction DR3.

In an embodiment, each of the fourth to sixth widths W4, W5, and W6 ranges from several tens of micrometers to several hundred micrometers. The fourth depth HH4 is less than the thickness of the encapsulation substrate EC. In an embodiment, the fourth depth HH4 ranges from several tens of micrometers to several hundred micrometers. FIG. 12B shows that each of the fourth to sixth widths W4, W5, and W6 are equal to each other, but embodiments of the inventive concept are not necessarily limited thereto. In an embodiment, at least one of the fourth to sixth widths W4, W5, and W6 differs from the others. In addition, FIG. 12B shows that the first to third outer groove patterns OP1, OP2, and OP3 have the same fourth depth HH4, but embodiments of the inventive concept are not necessarily limited thereto. In an embodiment, at least one of the first to third outer groove patterns OP1, OP2, and OP3 has a recess depth that differs from the others.

FIG. 12B shows, as an example, that the second and third outer groove patterns OP2 and OP3 are filled with a filling layer RL-0, but embodiments of the inventive concept are not necessarily limited thereto. In an embodiment, one end of the filling layer RL-0 is located between the first outer dam DAM-01 and the first outer groove pattern OP1. In an embodiment, one end of the filling layer RL-0 is located between the third outer groove pattern OP3 and the second outer dam DAM-02, and the first to third outer groove patterns OP1, OP2, and OP3 are not filled with the filling layer RL-0.

In a display device DD according to an embodiment of the inventive concept, the first to third outer groove patterns OP1, OP2, and OP3 that overlap a non-display region NAA are formed in the encapsulation substrate EC. Thus, without increasing the width of the non-display region NAA, the volume of the filling layer RL-0 that can be accommodated in the non-display region NAA can be increased. Accordingly, reliability of the display device DD is increased.

FIG. 13 is a plan view of a display device according to an embodiment of the inventive concept.

Referring to FIG. 13, in an embodiment, a plurality of outer groove patterns OP4 are spaced apart from each other when viewed in a plan view. The plurality of outer groove patterns OP4 surround a display region AA. The plurality of outer groove patterns OP4 may be distributed in a non-display region NAA.

FIG. 13 shows that each of the plurality of outer groove patterns OP4 has a circular shape, but embodiments of the inventive concept are not necessarily limited thereto. In an embodiment, each of the outer groove patterns OP4 has a polygonal shape.

In a display device and an electronic device according to the embodiment of the inventive concept, a light compensation layer is provided in a hole through which an electronic module is exposed, and the function of the electronic module is enhanced. In addition, during a process of forming the light compensation layer, the fluid is prevented from leaking into a region in which the pixels are located.

Accordingly, the occurrence of pixel defects of the display device can be prevented and display efficiency and reliability of the display device and the electronic device can be increased.

Although embodiments of the present disclosure have been described with reference to the drawings, it will be understood that various changes and modifications of embodiments of the present disclosure may be made by one skilled in the art or one having ordinary knowledge in the art without departing from the spirit and technical field of embodiments of the present disclosure as hereinafter claimed. Hence, the technical scope of the inventive concept is to be determined by the following claims, and should not be limited by the foregoing description.

What is claimed is:

1. A display device, comprising:
a signal transmission region;
a display region spaced apart from the signal transmission region; and
a peripheral region located between the signal transmission region and the display region;
a base layer;
a circuit layer disposed on the base layer;
a light emitting element layer disposed on the circuit layer and that comprises a light emitting element that overlaps the display region;
an encapsulation substrate disposed on the light emitting element layer;
a hole defined in the signal transmission region and that passes through at least a portion of each of the circuit layer and the light emitting element layer; and
a groove pattern defined on one surface of the encapsulation substrate and that overlaps the peripheral region.

2. The display device of claim 1, wherein the encapsulation substrate comprises a first surface and a second surface that face each other,
wherein the first surface is disposed on the light emitting element layer, and the second surface is located above the first surface,
wherein the groove pattern has a shape recessed from a portion of the first surface toward the second surface.

3. The display device of claim 1, wherein the peripheral region surrounds at least a portion of the signal transmission region when viewed in a plan view.

4. The display device of claim 1, further comprising a light compensation layer that is located between the encapsulation substrate and the base layer and that overlaps the hole,
wherein the light compensation layer overlaps the signal transmission region and the peripheral region but does not overlap the display region when viewed in a plan view.

5. The display device of claim 1, further comprising an input sensor disposed on the encapsulation substrate,
wherein the input sensor comprises a cover pattern that overlaps the peripheral region and an insulating layer that covers the cover pattern.

6. The display device of claim 5, wherein the input sensor further comprises a first conductive pattern located in the same layer as the cover pattern and a second conductive pattern disposed on the insulating layer.

7. The display device of claim 1, wherein the light emitting element does not overlap the signal transmission region or the peripheral region.

8. The display device of claim 1, wherein the groove pattern has a closed curved shape that surrounds the hole when viewed in a plan view.

9. The display device of claim 1, wherein the groove pattern comprises a first groove pattern that has a closed curved shape that surrounds the hole when viewed in a plan view and a second groove pattern that has a closed curved shape that surrounds the first groove pattern when viewed in the plan view.

10. The display device of claim 9, wherein a depth of the first groove pattern is equal to a depth of the second groove pattern.

11. The display device of claim 9, wherein a depth of the first groove pattern differs from a depth of the second groove pattern.

12. The display device of claim 1, wherein the groove pattern includes a plurality of groove patterns, and the plurality of groove patterns are spaced apart from each other and surround the hole when viewed in a plan view, and
each of the plurality of groove patterns has one of circular or polygonal shape.

13. The display device of claim 1, wherein the circuit layer comprises a plurality of insulating layers disposed in the peripheral region and the display region, and
the light emitting element layer further comprises a pixel defining layer disposed on the plurality of insulating layers.

14. The display device of claim 13, further comprising:
a first dam disposed in the peripheral region, wherein the first dam comprises the pixel defining layer and surrounds at least a portion of the hole; and
a second dam disposed in the peripheral region, wherein the second dam comprises the pixel defining layer and surrounds at least a portion of the first dam,
wherein the groove pattern is located between the first dam and the second dam.

15. The display device of claim 14, wherein a height of the second dam is greater than a height of the first dam.

16. A display device, comprising:
a base layer that includes a display region and a non-display region;
a circuit layer disposed on the base layer;
a light emitting element layer disposed on the circuit layer and that includes a light emitting element located in the display region;
an encapsulation substrate disposed on the light emitting element layer; and
an outer groove pattern formed on one surface of the encapsulation substrate and that overlaps the non-display region.

17. An electronic device, comprising:
a display device, wherein the display device comprises:
a base layer;
a circuit layer disposed on the base layer;

a light emitting element layer disposed on the circuit layer and that includes a light emitting element;

an encapsulation substrate disposed on the light emitting element layer, a hole formed in each of the circuit layer and the light emitting element layer and that passes through at least a portion thereof; and a groove pattern formed on a lower surface of the encapsulation substrate and adjacent to the hole, wherein the groove pattern is located between the hole and the light emitting element when viewed in a plan view.

18. The electronic device of claim 17, further comprising a light compensation layer disposed between the light emitting element layer and the encapsulation substrate, wherein the light compensation layer covers the hole and does not overlap the light emitting element.

19. The electronic device of claim 17, further comprising an input sensor disposed on the encapsulation substrate, wherein the input sensor comprises a cover pattern that overlaps the groove pattern, a first conductive layer, a first insulating layer that covers the cover pattern and the first conductive layer, a second conductive layer disposed on the first insulating layer, and a second insulating layer that covers the second conductive layer.

20. The electronic device of claim 17, wherein the display device further comprises an electronic module disposed below the base layer and that overlaps the hole when viewed in a plan view.

21. A display device, comprising:

a circuit layer disposed on a base layer;

a light emitting element layer disposed on the circuit layer and that comprises a light emitting element;

an encapsulation substrate disposed on the light emitting element layer and that includes a first surface disposed on the light emitting element layer, and a second surface located above the first surface;

a hole that passes through at least a portion of each of the circuit layer and the light emitting element layer; and a groove pattern recessed from a portion of the first surface of the encapsulation substrate toward the second surface of the encapsulation substrate, wherein the groove pattern has a closed curved shape that surrounds the hole when viewed in a plan view.

22. The display device of claim 21, further comprising:

a signal transmission region;

a display region spaced apart from the signal transmission region; and a peripheral region located between the signal transmission region and the display region, wherein the light emitting element overlaps the display region, the hole is formed in the signal transmission region, and the groove pattern overlaps the peripheral region.

* * * * *